(12) United States Patent
Fukuda et al.

(10) Patent No.: US 10,290,494 B2
(45) Date of Patent: May 14, 2019

(54) METHOD OF MANUFACTURING SEMICONDUCTOR DEVICE AND METHOD OF PROCESSING SUBSTRATE

(71) Applicant: Kokusai Electric Corporation, Tokyo (JP)

(72) Inventors: Masanao Fukuda, Toyama (JP); Takafumi Sasaki, Toyama (JP); Kazuhiro Yuasa, Takaoka (JP)

(73) Assignee: Kokusai Electric Corporation, Tokyo (JP)

( * ) Notice: Subject to any disclaimer, the term of this patent is extended or adjusted under 35 U.S.C. 154(b) by 142 days.

(21) Appl. No.: 15/208,708

(22) Filed: Jul. 13, 2016

(65) Prior Publication Data

US 2016/0322217 A1 Nov. 3, 2016

Related U.S. Application Data

(62) Division of application No. 12/536,061, filed on Aug. 5, 2009, now abandoned.

(30) Foreign Application Priority Data

Aug. 6, 2008 (JP) ................................ 2008-203187
Jun. 9, 2009 (JP) ................................ 2009-138577

(51) Int. Cl.
*H01L 21/02* (2006.01)
*H01L 21/316* (2006.01)
(Continued)

(52) U.S. Cl.
CPC ........ *H01L 21/02238* (2013.01); *C23C 16/40* (2013.01); *C23C 16/401* (2013.01);
(Continued)

(58) Field of Classification Search
CPC ......... H01L 21/31662; H01L 21/02255; H01L 21/02238; C23C 16/40; C23C 16/401;
(Continued)

(56) References Cited

U.S. PATENT DOCUMENTS 4,800,105 A * 1/1989 Nakayama ............ C23C 16/455
427/253
5,334,277 A * 8/1994 Nakamura .............. C30B 25/02
117/102
(Continued)

FOREIGN PATENT DOCUMENTS

JP 04165621 A 6/1992
JP 05206106 8/1993
(Continued)

OTHER PUBLICATIONS

Korean Office Action dated May 9, 2011 in Korean counterpart patent application No. 10-2009-0071991 w/English translation.

*Primary Examiner* — Jeffrie R Lund
(74) *Attorney, Agent, or Firm* — Brundidge & Stanger, P.C.

(57) ABSTRACT

A substrate processing apparatus including: a reaction tube configured to process a plurality of substrates; a heater configured to heat an inside of the reaction tube; a holder configured to arrange and hold the plurality of substrates within the reaction tube; a hydrogen-containing gas supply system including a first nozzle disposed in an area which horizontally surrounds a substrate arrangement area where the plurality of substrates are arranged, and configured to supply a hydrogen-containing gas from a plurality of locations of the area into the reaction tube; an oxygen-containing gas supply system including a second nozzle disposed in the area which horizontally surrounds the substrate arrangement area, and configured to supply an oxygen-containing gas (Continued)

from a plurality of locations of the area into the reaction tube; a pressure controller configured to control a pressure inside the reaction tube to be lower than an atmospheric pressure; and a controller configured to control the heater, the hydrogen-containing gas supply system, the oxygen-containing gas supply system and the pressure controller such that the hydrogen-containing gas and the oxygen-containing gas are supplied simultaneously into the reaction tube accommodating the plurality of substrates and being under a heated atmosphere having a pressure lower than an atmospheric pressure through the first nozzle and the second nozzle, respectively, so that the hydrogen-containing gas and the oxygen-containing gas react with each other in the area which horizontally surrounds the substrate arrangement area to form a reactive species in the reaction tube, thereby thermally oxidizing each of the plurality of substrates by the reactive species, wherein the first nozzle is provided with a plurality of first gas ejection holes, and the second nozzle is provided with as many second gas ejection holes as at least the plurality of substrates such that at least each of the second gas ejection holes corresponds to each of the plurality of substrates is disclosed.

12 Claims, 18 Drawing Sheets

(51) Int. Cl.
  C23C 16/40 (2006.01)
  C23C 16/455 (2006.01)
  C23C 16/458 (2006.01)
  C23C 16/52 (2006.01)
(52) U.S. Cl.
  CPC .... C23C 16/4583 (2013.01); C23C 16/45519 (2013.01); C23C 16/45546 (2013.01); C23C 16/45548 (2013.01); C23C 16/45578 (2013.01); C23C 16/52 (2013.01); H01L 21/02255 (2013.01); H01L 21/31662 (2013.01)
(58) Field of Classification Search
  CPC ........ C23C 16/45519; C23C 16/45546; C23C 16/45548; C23C 16/45565; C23C 16/45578; C23C 16/4583; C23C 16/52
  USPC ................. 118/715, 724, 725, 696
  See application file for complete search history.

(56) References Cited

U.S. PATENT DOCUMENTS

| | | | | |
|---|---|---|---|---|
| 5,433,169 A * | 7/1995 | Nakamura | ............... | C30B 25/02 117/102 |
| 5,702,531 A | 12/1997 | Mikata | | |
| 5,902,102 A | 5/1999 | Nam | | |
| 6,402,849 B2 | 6/2002 | Kwag et al. | | |
| 6,599,845 B2 * | 7/2003 | Sato | ......................... | C01B 13/00 257/E21.285 |
| 7,102,104 B2 | 9/2006 | Saito | | |
| 7,129,186 B2 | 10/2006 | Hasebe et al. | | |
| 7,229,502 B2 | 6/2007 | Wang | | |
| 7,304,002 B2 | 12/2007 | Nishita | | |
| 7,304,003 B2 | 12/2007 | Suzuki et al. | | |
| 7,534,730 B2 * | 5/2009 | Ozaki | ................. | H01L 21/0223 118/719 |
| 7,625,604 B2 | 12/2009 | Suzuki | | |
| 7,871,938 B2 * | 1/2011 | Ozaki | ................. | H01L 21/0223 118/719 |
| 7,910,494 B2 * | 3/2011 | Dip | ......................... | C30B 25/14 431/174 |
| 8,349,083 B2 * | 1/2013 | Takasuka | ............. | C23C 16/4401 118/715 |
| 8,349,403 B2 * | 1/2013 | Takasuka | ............. | C23C 16/4401 118/715 |
| 8,628,616 B2 * | 1/2014 | Takasuka | ............. | C23C 16/4401 118/715 |
| 8,822,350 B2 * | 9/2014 | Yuasa | ..................... | C23C 16/40 438/584 |
| 8,901,013 B2 * | 12/2014 | Yuasa | ................. | H01L 21/3105 118/696 |
| 2001/0050054 A1 * | 12/2001 | Kwag | ................. | C23C 16/4412 118/715 |
| 2003/0175426 A1 * | 9/2003 | Shiratori | ............. | C23C 16/4401 427/255.37 |
| 2004/0025786 A1 * | 2/2004 | Kontani | ................. | C23C 16/452 118/715 |
| 2004/0112290 A1 | 6/2004 | Li | | |
| 2005/0164518 A1 * | 7/2005 | Hasebe | ............. | H01L 21/02238 438/766 |
| 2005/0196533 A1 | 9/2005 | Hasebe | | |
| 2005/0201894 A1 | 9/2005 | Suzuki | | |
| 2005/0266696 A1 | 12/2005 | Wang | | |
| 2006/0032442 A1 | 2/2006 | Hasebe | | |
| 2006/0121193 A1 * | 6/2006 | Strauch | ................. | C23C 16/303 427/248.1 |
| 2006/0124058 A1 | 6/2006 | Sakai | | |
| 2006/0150905 A1 | 7/2006 | Sakai | | |
| 2006/0276051 A1 * | 12/2006 | Hasebe | ............. | H01L 21/02238 438/766 |
| 2007/0034158 A1 | 2/2007 | Nakaiso | | |
| 2007/0157882 A1 | 7/2007 | Ozaki | | |
| 2008/0075838 A1 | 3/2008 | Inoue | | |
| 2008/0216742 A1 | 9/2008 | Takebayashi | | |
| 2008/0251014 A1 | 10/2008 | Kontani | | |
| 2008/0251015 A1 | 10/2008 | Kontani | | |
| 2009/0088001 A1 | 4/2009 | Nakagawa | | |
| 2009/0114156 A1 | 5/2009 | Nodera | | |
| 2009/0197424 A1 | 8/2009 | Sakai | | |
| 2009/0223448 A1 | 9/2009 | Sakai | | |
| 2009/0291566 A1 | 11/2009 | Ueno | | |
| 2009/0305512 A1 | 12/2009 | Matsuura | | |
| 2010/0009079 A1 | 1/2010 | Yamazaki | | |
| 2010/0035440 A1 * | 2/2010 | Fukuda | ............. | H01L 21/02238 438/765 |
| 2010/0135877 A1 | 6/2010 | Watanabe | | |
| 2010/0192855 A1 | 8/2010 | Yuasa | | |
| 2011/0045675 A1 | 2/2011 | Miya | | |
| 2011/0065286 A1 * | 3/2011 | Sasaki | ............... | H01L 21/02233 438/770 |
| 2013/0157474 A1 * | 6/2013 | Yuasa | .................. | H01L 21/3105 438/758 |
| 2013/0280919 A1 * | 10/2013 | Yuasa | ..................... | C23C 16/40 438/778 |
| 2016/0322217 A1 * | 11/2016 | Fukuda | ............. | H01L 21/02238 |

FOREIGN PATENT DOCUMENTS

| | | |
|---|---|---|
| JP | 09053179 | 2/1997 |
| JP | 2005-175441 | 6/2005 |
| JP | 2005-311301 | 11/2005 |
| JP | 2008-78452 | 4/2008 |
| JP | 2008103642 | 5/2008 |
| JP | 2008-133772 | 6/2008 |
| KR | 1020070112446 A | 11/2007 |
| KR | 1020080027199 A | 3/2008 |
| WO | 2005/020309 | 3/2005 |
| WO | WO2005/020309 | 3/2005 |
| WO | 2007043478 A1 | 4/2007 |

* cited by examiner

METHOD OF MANUFACTURING SEMICONDUCTOR DEVICE AND METHOD OF PROCESSING SUBSTRATE

CROSS-REFERENCE TO RELATED PATENT APPLICATION

This U.S. non-provisional patent application is a divisional application of U.S. patent application Ser. No. 12/536,061, filed Aug. 5, 2009; which claims priority under 35 U.S.C. § 119 of Japanese Patent Applications No. 2008-203187, filed on Aug. 6, 2008, and No. 2009-138577, filed on Jun. 9, 2009, in the Japanese Patent Office, the entire contents of which are hereby incorporated by reference.

BACKGROUND OF THE INVENTION

1. Field of the Invention

The present invention relates to a substrate processing apparatus for processing a substrate, and a method of manufacturing a semiconductor device which includes a process of processing a substrate by using the substrate processing apparatus, and more particularly, to an oxidation apparatus for oxidizing the surface of a substrate, and a method of manufacturing a semiconductor device, such as IC, which includes a process of oxidizing a substrate by using the oxidation apparatus.

2. Description of the Prior Art

FIG. 1 is an overall view of an apparatus for manufacturing a semiconductor device (semiconductor manufacturing apparatus) as a conventional substrate processing apparatus. The conventional apparatus is configured by a cassette stocker 1' that mounts a wafer cassette, a boat 3', a wafer transfer unit (transfer device) that transfers a wafer between the wafer cassette mounted on the cassette stocker 1' and the boat 3', a boat elevating unit (boat elevator) 4' that loads the boat 3' into a heat-treating furnace and unloads the boat 3' from the heat-treating furnace, and the heat-treating furnace 5' provided with a heating unit (heater).

To explain the prior art, the heat-treating furnace 5' of the semiconductor manufacturing apparatus having the configuration of FIG. 2 is exemplified. The apparatus shown in FIG. 1 includes the boat 3' that holds about 100 to 150 sheets of stacked wafers 6', main nozzles 7', sub-nozzles 8' arranged in multiple stages, a heater 9', a reaction tube 10', and a gas exhaust outlet 11'. A gas supply unit configured by the main nozzles 7', as shown in FIG. 3, may be configured in a form of a shower plate 12'. This apparatus forms a silicon oxide film as an oxide film on a wafer 6', such as a silicon wafer, by supplying from the main nozzles 7' $O_2$ gas at a flow rate of several thousands of sccm and $H_2$ gas at a flow rate lower than $O_2$ gas, for example, several hundreds of sccm, at a temperature of about 850 to 950° C. and under a low pressure environment of about 0.5 Torr (67 Pa) and also by assistantly supplying $H_2$ gas at a relatively low flow rate from the sub-nozzles 8' at the same time so as to form a film uniformly over the entire stacked wafers.

It is known that the growth of the oxide film requires $O_2$, but the growth rate of the oxide film is extremely low in a source gas of an $O_2$ single body under a low pressure environment of about 50 Pa. Hence, the growth rate of the oxide film gets faster when $H_2$ gas is added (for example, see Patent Document 1). Also, the oxide film is not formed in an $H_2$ single body. That is, when seen as a whole, the growth of the oxide film depends on concentrations (flow rates or partial pressures) of both $O_2$ and $H_2$.

PRIOR ART DOCUMENT

Patent Document

[Patent Document 1] Pamphlet of International Publication No. WO2005/020309

The most characteristic film thickness distribution in the conventional apparatus is shown in FIG. 4. This is a film thickness distribution of an oxide film formed on a wafer when $O_2$ gas of several thousands of sccm and $H_2$ gas of several hundreds of sccm are supplied as source gases from the main nozzles 7' only in the above-described pressure and temperature zones. According to the graph of FIG. 4, the film thickness of the oxide film formed on the wafer becomes thinner over from the top to the bottom. As described in the specification of Japanese Patent Application No. 2008-133772, filed by the present applicant, atomic oxygen O that is an intermediate product contributes to the growth of the oxide film. $O_2$ gas and $H_2$ gas supplied from the main nozzles 7' temporarily reach a state close to a chemical equilibrium in the top area, and then, show a behavior that flows between the periphery of a wafer and the inner wall of a reaction tube, while a mole fraction of each intermediate product is constantly maintained. At this time, since a mixed gas of the source gas and the intermediate product comes under a flow resistance, the density of the mixed gas at the top is high and the density of the mixed gas at the bottom is low. Accordingly, the mole density of the atomic oxygen O changes at the top and the bottom, causing the difference in the film thickness of the oxide film formed on the wafer at the top and the bottom. Also, since the atomic oxygen O is consumed when the oxide film is grown on the wafer, the atomic oxygen O is insufficient over from the top and the bottom, and therefore, the difference of the film thickness is caused as shown in FIG. 4. Such a phenomenon is called a loading effect, and it equally occurs even in the construction having a shower plate 12' as shown in FIG. 3. In the conventional construction, in order to eliminate the loading effect, the sub-nozzles 8' for $H_2$ gas supply are arranged in multiple stages (in the cases of FIG. 2 and FIG. 3, four stages), and mass flow controllers configured to individually control the respective sub-nozzles 8' are intervened to supply an appropriate amount of $H_2$ gas, thereby correcting the film thickness uniformity between wafer surfaces.

It is known that integrated circuit (IC) patterns are formed on the wafer so as to manufacture IC, but a gas flow rate (amount of atomic oxygen O) for growing an oxide film with the same film thickness on the wafer is different depending on the circuit patterns. If consideration is given based on the case of forming an oxide film on a bare wafer, in particularly, in the case of a wafer with deep recessed patterns such as shallow trench isolation (STI) or the like as shown in FIG. 5, since the exposed surface area of Si is dozens of times the surface area of the bare wafer, a large amount of the source gas (atomic oxygen O) is consumed by the film growth. On the contrary, as shown in FIG. 6, in the case of a wafer that is partially covered with an oxide film, a gas flow rate (amount of atomic oxygen O) necessary for the film growth is low compared to the bare wafer. As such, the consumed amount of the source gas (atomic oxygen O) necessary for forming the oxide film with the same film thickness on the wafer is different, depending on circuit patterns formed on the wafer. Therefore, the flow rate of $H_2$ gas supplied from the sub-nozzles 8' for uniformizing the film thickness of the oxide films formed on the wafers in a wafer stack direction changes (this is called a "circuit pattern dependency of the loading effect"). When a wafer consuming a small amount of a source gas as shown in FIG. 6 is loaded, the film thickness distribution of an oxide film formed on the wafer is represented by (a) of FIG. 7. When a bare wafer is loaded, the film thickness distribution of an oxide film formed on the bare wafer is represented by (b) of FIG. 7. When a wafer consuming a large amount of a source gas as shown in FIG. 5 is loaded, the film thickness distribution of an oxide film formed on the wafer is represented by (c) of FIG. 7. As such, since the loading effect changes according to the circuit patterns of the wafer surface, the optimum flow rate distribution of $H_2$ gas supplied from the sub-nozzles 8' to each other is different.

Regarding the loading effect, by utilizing a tool that calculates an optimum flow rate of a source gas in order for uniform film formation, which is described in the specification of Japanese Patent Application No. 2008-133772, filed by the present applicant, the optimum flow rate of $H_2$ gas supplied from the sub-nozzles 8' is calculated in a requisite minimum (1-2 times) test film formation, and the inter-wafer film thickness uniformity of the oxide films formed on the wafers is corrected.

In the case of the conventional construction, a gas flow traversing the wafer does not mostly exist, and the film-forming contribution gas (atomic oxygen O) infiltrates between the wafers due to a concentration diffusion only directed from the periphery of the wafer to the central part of the wafer. Thus, there is a limit in the intra-wafer film thickness uniformity (in most process wafers, the film thickness has a mortar-shaped intra-wafer film thickness distribution). Positions of the sub-nozzles experimented on the bare wafers and a film thickness map of oxide films formed on the wafers are shown in FIG. 8. According to the film thickness map, the film thicknesses of the oxide films formed on the wafers have a center-concave (凹) distribution with uniformity at positions other than the positions where the sub-nozzles exist as represented in FIG. 8. It is thought that this is because the consumption of the atomic oxygen O on the wafer surface at those positions and the concentration diffusion directed from the periphery of the wafer to the central part of the wafer are dominant. According to the film thickness map of FIG. 8, the intra-wafer film thickness uniformity at the positions where the sub-nozzles do not exist has the center-concave (凹) distribution. The intra-wafer film thickness uniformity at the positions where the sub-nozzles exist has a slightly-lessened center-concave (凹) distribution.

Regarding this phenomenon, explanation will be given on a Computational Fluid Dynamics (CFD) analysis (thermo-fluid analysis) based on an elementary reaction that is carried out at a process temperature (temperature inside the processing chamber) of 900° C., a process pressure (pressure inside the processing chamber) of 0.5 Torr, and $O_2:H_2=15:1$ by using a two-dimensional axisymmetric calculating area shown in FIG. 9. The bare wafer was supposed as the process wafer. Also, the CFD analysis was performed by using a general-purpose thermo-fluid analysis tool. A detailed explanation of the calculation model is described in the specification of Japanese Patent Application No. 2008-133772, filed by the present applicant. A normal calculation result under calculation conditions of FIG. 9 (mole density distribution of atomic oxygen O at the inside of the processing chamber) is shown in FIG. 10. According to the O density distribution shown in FIG. 10, it is determined that the difference of concentration occurs in a radial direction of the wafer in a normal state, and the concentration becomes normal in this state. Since the intra-wafer film thickness distribution of the oxide film formed on the wafer directly depends on the O concentration, the difference of the film thickness naturally occurs in the radial direction of the wafer, and FIG. 10 shows that the intra-wafer film thickness distributions of the oxide films formed on all wafers other than the top wafers have the center-concave (凹) (mortar) distribution.

FIG. 11 shows an O concentration distribution (mole density distribution of atomic oxygen O at the inside of the processing chamber) when $H_2$ is supplied from the sub-nozzles. Since it is a two-dimensional axisymmetric system, a three-dimensional nozzle shape is not correctly reproduced, but it shows a qualitative result in which a flow caused by a low pressure field of a diffusion control of about 0.5 Torr is ignored to some extent. The intra-wafer O concentration distribution of the wafer that has a center-convex distribution at the positions where $H_2$ halfway supply nozzles (sub-nozzles) are added, which are represented by Nozzle in FIG. 11, and the intra-wafer O concentration distribution of the wafer that has a center-concave distribution at the positions where the sub-nozzles do not exist are qualitatively shown. These calculation result does not completely coincide with the experimental result, but they well coincide with each other in the qualitative tendency (center-concave distribution at the positions where the sub-nozzles do not exist, and reduction of the center-concave distribution at the positions near the sub-nozzles). The reason why the calculation result and the experimental result do not completely coincide with each other is that a surface reaction that is a complex reaction mechanism in practice is simply assumed in calculation, and a three-dimensional flow is not considered in calculation (two-dimensional axisymmetric system calculation).

For example, as described above, since the wafer with deep recessed patterns such as STI shown in FIG. 5 consumes a larger amount of a source gas (atomic oxygen O) than the bare wafer, the center-concave distribution of the intra-wafer film thickness distribution is prominent at the positions where the sub-nozzles do not exist. That is, in order to obtain a flat intra-wafer film thickness distribution when processing the wafer with the deep recessed patterns such as STI, it is preferable that the intra-wafer film thickness distribution actively becomes the center-convex (凸) distribution when processing the bare wafer. The degradation of the intra-wafer film thickness uniformity according to this phenomenon (center-concave (凹) distribution of the intra-wafer film thickness distribution) may be avoided by enlargement of a wafer stack pitch or a low pressurization inside a reaction chamber during wafer processing. However, the enlargement of the wafer stack pitch lowers throughput, and the lower pressurization inside the reaction chamber significantly lowers an overall oxidation rate.

SUMMARY OF THE INVENTION

An object of the present invention is to provide a substrate processing apparatus, which is capable of suppressing the intra-wafer film thickness distribution from being a center-concave (凹) distribution, while the inter-wafer film thickness uniformity is maintained, and improving the intra-wafer film thickness distribution, and to provide a method of manufacturing a semiconductor device, which includes a process of processing a substrate by using the substrate processing apparatus.

According to an aspect of the present invention, there is provided a substrate processing apparatus including: a reaction tube configured to process a plurality of substrates; a heater configured to heat an inside of the reaction tube; a holder configured to arrange and hold the plurality of substrates within the reaction tube; a hydrogen-containing gas supply system including a first nozzle disposed in an area which horizontally surrounds a substrate arrangement area where the plurality of substrates are arranged, and configured to supply a hydrogen-containing gas from a plurality of locations of the area into the reaction tube; an oxygen-containing gas supply system including a second nozzle disposed in the area which horizontally surrounds the substrate arrangement area, and at a position opposite to the hydrogen-containing gas supply system, and configured to supply an oxygen-containing gas from a plurality of locations of the area into the reaction tube; a shower plate installed on a ceiling wall of the reaction tube, the shower plate being provided with gas supply ports configured to supply gases downward; a buffer chamber defined by the ceiling wall and the shower plate, the buffer chamber being configured to be capable of mixing the gases supplied thereinto; a pressure controller configured to control a pressure inside the reaction tube to be lower than an atmospheric pressure; and a controller configured to control the heater, the hydrogen-containing gas supply system, the oxygen-containing gas supply system and the pressure controller such that the hydrogen-containing gas and the oxygen-containing gas are supplied simultaneously into the reaction tube accommodating the plurality of substrates and being under a heated atmosphere having a pressure lower than an atmospheric pressure through at least the first nozzle and the second nozzle, respectively, so that the hydrogen-containing gas and the oxygen-containing gas react with each other to generate atomic oxygen as a reactive species in the reaction tube, thereby thermally oxidizing each of the plurality of substrates by the atomic oxygen, wherein the first nozzle is L-shaped and is provided with a plurality of first gas ejection holes, and the second nozzle is L-shaped and is provided with as many second gas ejection holes as at least the plurality of substrates such that each of at least a part of the second gas ejection holes corresponds to each of at least the plurality of substrates.

According to another aspect of the present invention, there is provided a method of manufacturing a semiconductor device, including: loading a plurality of substrates into a reaction tube; processing the plurality of substrates by supplying hydrogen-containing gas and oxygen-containing gas into the reaction tube, which is in a heated state, with pressure inside the reaction tube being lower than atmospheric pressure, respectively through a first nozzle and a second nozzle disposed in an area corresponding to a substrate arrangement area where the plurality of substrates are arranged; and unloading the plurality of processed substrates from the reaction tube, wherein when the substrates are processed, the hydrogen-containing gas is supplied into the reaction tube from a plurality of locations of the area corresponding to the substrate arrangement area through a plurality of first gas ejection holes installed in the first nozzle and, at the same time, the oxygen-containing gas is supplied into the reaction tube from a plurality of locations of the area corresponding to the substrate arrangement area through second gas ejection holes installed as many as at least the plurality of substrates in the second nozzle so that the second gas ejection holes are in 1:1 correspondence with at least the plurality of substrates.

DETAILED DESCRIPTION OF THE PREFERRED EMBODIMENTS

The inventors found that when $O_2$ gas as well as $H_2$ gas was supplied from sub-nozzles installed in an inner side of a reaction tube, that is, $O_2$ gas as well as $H_2$ gas was supplied from a plurality of locations of an area corresponding to a wafer arrangement area where a plurality of sheets of wafers were arranged, a reaction was controlled so that atomic oxygen O is generated much more at a wafer central part while an atomic oxygen O concentration was suppressed from increasing at a wafer edge part, whereby a prominent center-concave (凹) distribution of an intra-wafer film thickness distribution (degradation of intra-wafer uniformity) could be prevented in a patterned wafer. Hereinafter, a first embodiment will be described with reference to drawings.

First Embodiment

Figure 12:
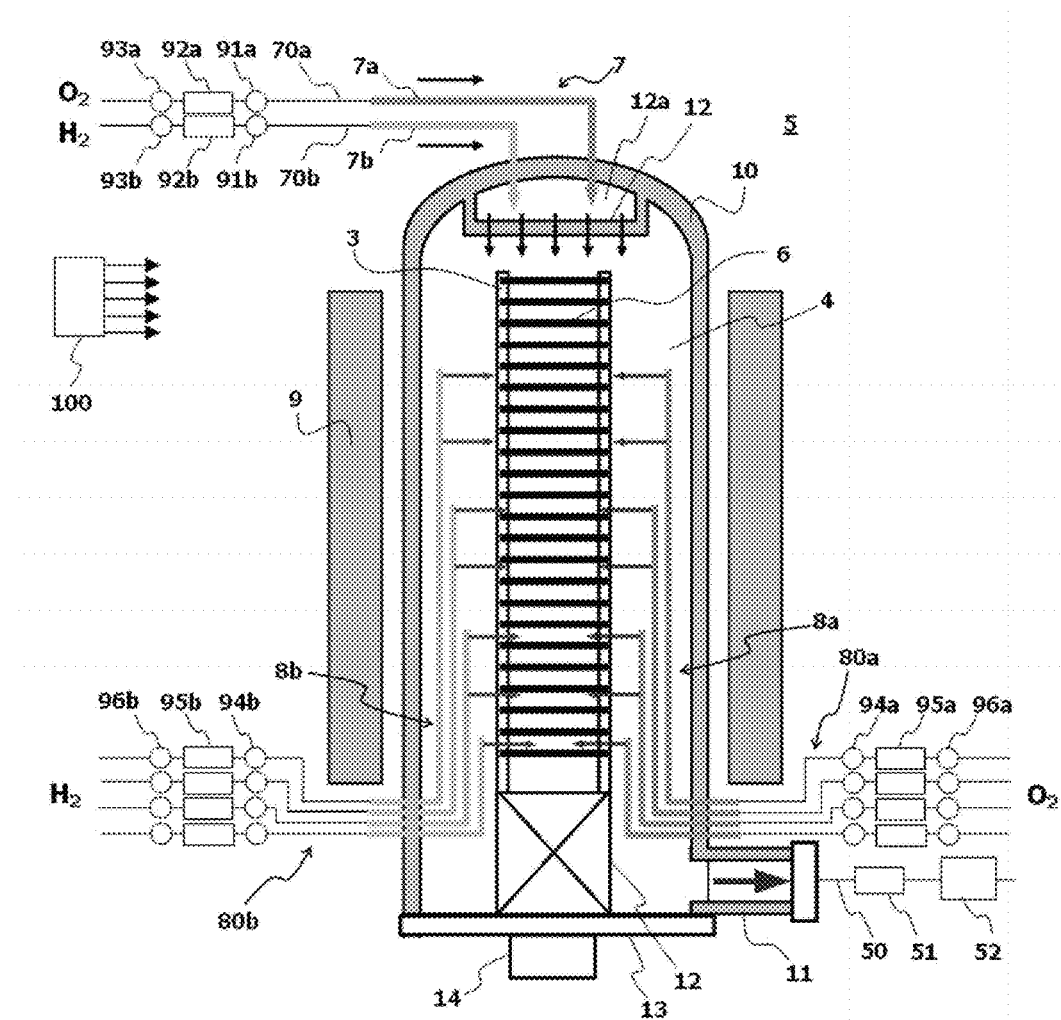
FIG. 12 is a schematic sectional view showing a configuration of a heat-treating furnace in accordance with a first embodiment of the present invention.

As a substrate processing apparatus in accordance with a first embodiment of the present invention, a batch-type vertical semiconductor manufacturing apparatus (oxidation apparatus) will be described with reference to FIG. 12. FIG. 12 is a schematic sectional view showing a configuration example of a heat-treating furnace (oxidation furnace) relevant to the first embodiment of the present invention. In FIG. 12, an apparatus configuration example of a heat-treating furnace 5 of a substrate processing apparatus whose maximum loading capacity is for example 120 sheets of wafers.

As shown in FIG. 12, the heat-treating furnace 5 of the substrate processing apparatus relevant to this embodiment includes a resistance heater 9 as a heat source. The heater 9 is cylindrically-shaped and is supported on a heater base (not shown) used as a holding plate so that the heater 9 is vertically installed. At the inside of the heater 9, a reaction tube 4 is installed concentrically with the heater 9. A processing chamber (reaction chamber) 4 that processes a substrate is formed inside the reaction tube 10, and the reaction tube 10 is configured such that a boat 3 used as a substrate holding tool is loaded. The boat 3 is configured to hold wafers 8 such as silicon wafers as a plurality of sheets of substrates in multiple stages in an approximately horizontal state at gaps (substrate pitch distances). In the following description, a wafer support position of an uppermost stage inside the boat 3 is represented by #120, and a wafer support position of a lowermost stage is represented by #1. In addition, a wafer 6 held at a support position of an n-th stage from the lowermost stage inside the boat 3 is represented by a wafer #n.

A lower portion of the reaction tube 10 is opened so that the boat 3 is inserted thereinto. The opening of the reaction tube 10 is tightly closed with a seal cap 13. On the seal cap 13, a heat insulation cap 12 that supports the boat 3 from the lower side is installed. The heat insulation cap 12 is installed in a rotation mechanism 14 through a rotation shaft (not shown) installed to penetrate the seal cap 13. The rotation mechanism 14 is configured to rotate the heat insulation cap 12 and the boat 3 through the rotation shaft so that the wafer 6 supported on the boat 3 is rotated.

A shower plate 12 is installed on a ceiling wall of the reaction tube 10, and a buffer chamber 12a as a mixing space is formed by the ceiling wall of the reaction tube 10 and the shower plate 12. Above the reaction tube 10, an oxygen supply nozzle 7a that supplies oxygen ($O_2$) gas as oxygen-containing gas from the upper side of the processing chamber 4 to wafers 6, and a hydrogen supply nozzle 7b that supplies hydrogen ($H_2$) gas as hydrogen-containing gas from the upper side of the processing chamber 4 to wafers 6 are connected to communicate with the inside of the buffer chamber 12a. A gas jet orifice of the oxygen supply nozzle 7a is directed downward and configured to jet oxygen gas downward from the upper side of the processing chamber 4 (along a wafer stack direction). A gas jet orifice of the hydrogen supply nozzle 7b is directed downward and configured to jet hydrogen gas downward from the upper side of the processing chamber 4 (along a wafer stack direction). $O_2$ gas supplied from the oxygen supply nozzle 7a and $H_2$ gas supplied from the hydrogen supply nozzle 7b are mixed inside the buffer chamber 12a and then supplied into the processing chamber 4 through the shower plate 12. A main nozzle 7 is configured by the oxygen supply nozzle 7a and the hydrogen supply nozzle 7b. In addition, the shower plate 12 is provided with gas supply ports that supply $O_2$ gas and $H_2$ gas in a shower manner from one end toward the other end of a wafer arrangement area where a plurality of sheets of wafers 6 are arranged.

An oxygen supply pipe 70a as an oxygen gas supply line is connected to the oxygen supply nozzle 7a. At the oxygen supply pipe 70a, an oxygen gas supply source (not shown), an open-close valve 93a, a mass flow controller (MFC) 92a as a flow rate control unit (flow rate controller), and an open-close valve 91a are installed sequentially from a upstream side. In addition, a hydrogen supply pipe 70b as a hydrogen gas supply line is connected to the hydrogen supply nozzle 7b. At the hydrogen supply pipe 70b, a hydrogen gas supply source (not shown), an open-close valve 93b, a mass flow controller (MFC) 92b as a flow rate control unit (flow rate controller), and an open-close valve 91b are installed sequentially from the upstream side.

A hydrogen supply nozzle 8b through which $H_2$ gas as hydrogen-containing gas is supplied from the side of the inside of the processing chamber 4 to the wafers 6 is connected to the side lower part of the reaction tube 10, while penetrating the sidewall of the reaction tube 10. The hydrogen supply nozzle 8b is disposed in a area corresponding to the wafer arrangement area, that is, a cylindrical area surrounding the wafer arrangement area with facing the wafer arrangement area at the inside of the reaction tube 10. The hydrogen supply nozzle 8b is configured by a plurality of (in this embodiment, four) L-shaped nozzles each having a different length and extending upward along the inner wall of the sidewall of the reaction tube 10. Since the plurality of nozzles constituting the hydrogen supply nozzle 8b have different lengths in the wafer arrangement direction, $H_2$ gas is supplied into the reaction tube 10 from a plurality of (in this embodiment, seven) locations of the area corresponding to the wafer arrangement area, and a hydrogen concentration inside the reaction chamber 4 in the wafer arrangement direction (vertical direction) is adjusted. The hydrogen supply nozzle 8b is installed along the inner wall nearer the inner wall of the sidewall of the reaction tube 10 than the wafers 6. A hydrogen sub-nozzle is configured by the hydrogen supply nozzle 8b. In addition, a first nozzle is configured by the hydrogen supply nozzle 8b.

Top surfaces of tips of the plurality of nozzles constituting the hydrogen supply nozzle 8b are closed, and at least one gas ejection hole is installed in a side surface of the tip portion of each nozzle. In FIG. 12, arrows extending from the hydrogen supply nozzle 8b toward the wafers 6 represent $H_2$ gas ejection directions from the respective gas ejection holes, and root parts of the arrows represent the respective gas ejection holes. That is, the gas ejection hole is directed toward the wafer and is configured to eject $H_2$ gas from the side inside the processing chamber 4 toward the wafer 6 in a horizontal direction (direction along a principal surface of the wafer). In the case of this embodiment, each of the longest nozzle, the second longest nozzle and the third longest nozzle is provided with two gas ejection holes, and the shortest nozzle is provided with one gas ejection hole. The plurality of (in this embodiment, seven) gas ejection holes are installed at equal distance. The lower gas ejection hole of the longest nozzle is installed at an intermediate position between the upper gas ejection hole of the longest nozzle and the upper gas ejection hole of the second longest nozzle. In addition, the lower gas ejection hole of the second longest nozzle is installed at an intermediate position between the upper gas ejection hole of the second longest nozzle and the upper gas ejection hole of the third longest nozzle. In addition, the lower gas ejection hole of the third longest nozzle is installed at an intermediate position between the upper gas ejection hole of the third longest nozzle and the gas ejection hole of the shortest nozzle. These installations of the gas ejection holes make it possible to supply $H_2$ gas that is finely adjusted in the wafer arrangement direction, and thus, the hydrogen concentration can be finely adjusted. A first gas ejection hole is configured by these gas ejection holes.

A hydrogen supply pipe 80b as a hydrogen gas supply line is connected to the hydrogen supply nozzle 8b. The hydrogen supply pipe 80b is configured by a plurality of (in this embodiment, four) pipes that are connected to the plurality of nozzles constituting the hydrogen supply nozzle 8b, respectively. At the hydrogen supply pipe 80b, a hydrogen gas supply source (not shown), an open-close valve 96b, a mass flow controller (MFC) 95b as a flow rate control unit (flow rate controller), and an open-close valve 94b are installed sequentially from a upstream side. The open-close valve 96b, the mass flow controller 95b, and the open-close valve 94b are installed in the respective pipes constituting the hydrogen supply pipe 80b and configured to independently control an $H_2$ gas flow rate at each of the nozzles constituting the hydrogen supply nozzle 8b.

An oxygen supply nozzle 8a through which $O_2$ gas as oxygen-containing gas is supplied from the side of the inside of the processing chamber 4 to the wafers 6 is connected to the side lower part of the reaction tube 10, while penetrating the sidewall of the reaction tube 10. The oxygen supply nozzle 8a is disposed in a area corresponding to the wafer arrangement area, that is, a cylindrical area surrounding the wafer arrangement area with facing the wafer arrangement area at the inside of the reaction tube 10. The oxygen supply nozzle 8a is configured by a plurality of (in this embodiment, four) L-shaped nozzles each having a different length and extending upward along the inner wall of the sidewall of the reaction tube 10. Since the plurality of nozzles constituting the oxygen supply nozzle 8a have different lengths in the wafer arrangement direction, $O_2$ gas is supplied into the reaction tube 10 from a plurality of (in this embodiment, seven) locations of the area corresponding to the wafer arrangement area, and an oxygen concentration inside the reaction chamber 4 in the wafer arrangement direction (vertical direction) is adjusted. The oxygen supply nozzle 8a is installed along the inner wall nearer the inner wall of the sidewall of the reaction tube 10 than the wafers 6. An oxygen sub-nozzle is configured by the hydrogen supply nozzle 8a. In addition, a second nozzle is configured by the oxygen supply nozzle 8a.

Top surfaces of tips of the plurality of nozzles constituting the oxygen supply nozzle 8a are closed, and at least one gas ejection hole is installed in a side surface of the tip portion of each nozzle. In FIG. 12, arrows extending from the oxygen supply nozzle 8a toward the wafers 6 represent $O_2$ gas ejection directions from the respective gas ejection holes, and a root part of each arrow represents each gas ejection hole. That is, the gas ejection hole is directed toward the wafer and is configured to eject $O_2$ gas from the side inside the processing chamber 4 toward the wafer 6 in a horizontal direction (direction along a principal surface of the wafer). In the case of this embodiment, each of the longest nozzle, the second longest nozzle and the third longest nozzle is provided with two gas ejection holes, and the shortest nozzle is provided with one gas ejection hole. The plurality of (in this embodiment, seven) gas ejection holes are installed at equal distance. The lower gas ejection hole of the longest nozzle is installed at an intermediate position between the upper gas ejection hole of the longest nozzle and the upper gas ejection hole of the second longest nozzle. In addition, the lower gas ejection hole of the second longest nozzle is installed at an intermediate position between the upper gas ejection hole of the second longest nozzle and the upper gas ejection hole of the third longest nozzle. In addition, the lower gas ejection hole of the third longest nozzle is installed at an intermediate position between the upper gas ejection hole of the third longest nozzle and the gas ejection hole of the shortest nozzle. These installations of the gas ejection holes make it possible to supply $O_2$ gas that is finely adjusted in the wafer arrangement direction, and thus, the oxygen concentration can be finely adjusted. A second gas ejection hole is configured by these gas ejection holes.

An oxygen supply pipe 80a as an oxygen gas supply line is connected to the oxygen supply nozzle 8a. The oxygen supply pipe 80a is configured by a plurality of (in this embodiment, four) pipes that are connected to the plurality of nozzles constituting the oxygen supply nozzle 8a, respectively. At the oxygen supply pipe 80a, an oxygen gas supply source (not shown), an open-close valve 96a, a mass flow controller (MFC) 95a as a flow rate control unit (flow rate controller), and an open-close valve 94a are installed sequentially from a upstream side. The open-close valve 96a, the mass flow controller 95a, and the open-close valve 94a are installed in the respective pipes constituting the oxygen supply pipe 80a and configured to independently control an $O_2$ gas flow rate at each of the nozzles constituting the oxygen supply nozzle 8a.

A main oxygen gas supply system is mainly configured by the oxygen supply nozzle 7a, the oxygen supply pipe 70a, the open-close valve 91a, the mass flow controller 92a, and the open-close valve 93a. A sub oxygen gas supply system is mainly configured by the oxygen supply nozzle 8a, the oxygen supply pipe 80a, the open-close valve 94a, the mass flow controller 95a, and the open-close valve 96a. An oxygen gas supply system is configured by the main oxygen gas supply system and the sub oxygen supply system.

A main hydrogen gas supply system is mainly configured by the hydrogen supply nozzle 7b, the hydrogen supply pipe 70b, the open-close valve 91b, the mass flow controller 92b, and the open-close valve 93b. A sub hydrogen gas supply system is mainly configured by the hydrogen supply nozzle 8b, the hydrogen supply pipe 80b, the open-close valve 94b, the mass flow controller 95b, and the open-close valve 96b. A hydrogen gas supply system is configured by the main hydrogen gas supply system and the sub hydrogen supply system.

A nitrogen gas supply system (not shown) is connected to the oxygen gas supply system and the hydrogen gas supply system. The nitrogen gas supply system is configured to supply nitrogen ($N_2$) gas as inert gas into the processing chamber 4 through the oxygen supply pipes 70a and 80a and the hydrogen supply pipes 70b and 80b. The nitrogen gas supply system is mainly configured by a nitrogen supply pipe (not shown), an open-close valve (not shown), and a mass flow controller (not shown).

At a side lower part of the reaction tube 10, a gas exhaust outlet 11 that exhausts the inside of the processing chamber is installed. A gas exhaust pipe 50 as a gas exhaust line is connected to the gas exhaust outlet 11. At the gas exhaust pipe 50, an auto pressure controller (APC) 51 as a pressure regulation unit (pressure controller), and a vacuum pump 52 as an exhaust unit (exhaust device) are installed sequentially from the upstream side. An exhaust system is mainly configured by the gas exhaust outlet 11, the gas exhaust pipe 50, the APC 51, and the vacuum pump 52.

The respective parts of the substrate processing apparatus, such as the resistance heater 9, the mass flow controllers 92a, 92b, 95a and 95b, the open-close valves 91a, 91b, 93a, 93b, 94a, 94b, 96a and 96b, the APC 51, the vacuum pump 52, and the rotation mechanism 14, are connected to a controller 100 as a control unit (control part), and the controller 100 is configured to control the operations of the respective parts of the substrate processing apparatus. The controller 100 is configured as a computer including a CPU, a storage device such as memory or HDD, a display device such as FPD, and an input device such as keyboard or mouse.

Next, explanation will be given on a method of oxidizing a wafer as a substrate, which is one of semiconductor device manufacturing processes, by using the above-described oxidation apparatus. In the following description, the operations of the respective parts constituting the oxidation apparatus are controlled by the controller 100.

When 1-batch quantity (for example 120 sheets) of wafers 6 are transferred and charged into the boat 3 by the substrate transfer device (wafer charge), the boat 3 charged with the plurality of sheets of wafers 6 is loaded into the processing chamber 4 of the heat-treating furnace 5 that is maintained in a heated state by the heater 9, and the inside of the reaction tube 10 is sealed by the seal cap 13. Subsequently, the inside of the reaction tube chamber 10 is vacuumed by the vacuum pump 52, and pressure inside the reaction tube 10 (pressure inside the furnace) is controlled to be a predetermined process pressure lower than atmospheric pressure by the APC 51. The boat 3 is rotated at a predetermined rotating speed by the rotation mechanism 14. In addition, temperature inside the processing chamber 4 (temperature inside the furnace) is increased to a predetermined process temperature.

After that, $O_2$ gas and $H_2$ gas are supplied into the processing chamber 4 by the oxygen supply nozzle 7a and the hydrogen supply nozzle 7b, respectively. That is, by opening the open-close valves 91a and 93a, $O_2$ gas whose flow rate is controlled by the mass flow controller 92a is supplied into the processing chamber 4 through the oxygen supply pipe 70a by the oxygen supply nozzle 7a. In addition, by opening the open-close valves 91b and 93b, $H_2$ gas whose flow rate is controlled by the mass flow controller 92b is supplied into the processing chamber 4 through the hydrogen supply pipe 70b by the hydrogen supply nozzle 7b. The $O_2$ gas supplied from the oxygen supply nozzle 7a and the $H_2$ gas supplied from the hydrogen supply nozzle 7b are mixed inside the buffer chamber 12a and then supplied through the shower plate 12 into the processing chamber 4 in a shower manner.

At this time, the oxygen supply nozzle 8a and the hydrogen supply nozzle 8b also supply $O_2$ gas and $H_2$ gas into the processing chamber 4, respectively. That is, by opening the open-close valves 94a and 96a, $O_2$ gas whose flow rate is controlled by the mass flow controller 95a is supplied into the processing chamber 4 through the oxygen supply pipe 80a by the oxygen supply nozzle 8a. In addition, by opening the open-close valves 94b and 96b, $H_2$ gas whose flow rate is controlled by the mass flow controller 95b is supplied into the processing chamber 4 through the hydrogen supply pipe 80b by the hydrogen supply nozzle 8b. The $O_2$ gas supplied from the oxygen supply nozzle 8a and the $H_2$ gas supplied from the hydrogen supply nozzle 8b are supplied into the processing chamber 4 from a plurality of locations of the area corresponding to the wafer arrangement area.

In this manner, the $O_2$ gas and the $H_2$ gas are supplied from one end side of the wafer arrangement area inside the processing chamber 4 and, at the same time, supplied from the plurality of locations of the area corresponding to the wafer arrangement area inside the processing chamber 4. The $O_2$ gas and the $H_2$ gas supplied into the processing chamber 4 flow down the inside of the processing chamber 4 and are exhausted from the gas exhaust outlet 11 installed at the other end side of the wafer arrangement area.

At this time, the $O_2$ gas and the $H_2$ gas react with each other inside the depressurized processing chamber 4 heated by the heater 5 to generate intermediate products such as H, O and OH. As described in the specification of Japanese Patent Application No. 2008-133772, filed by the present applicant, the representative intermediate product directly contributing to the oxide film formation among these intermediate products is atomic oxygen O, and the intermediate products such as H and OH are not directly involved in the surface reaction relating to the oxide film growth. That is, among the intermediate products generated by the reaction of the $O_2$ gas and the $H_2$ gas, the atomic oxygen O acts as reactive species (oxidizing species) and the oxidation process is performed on the wafers 6 so that silicon oxide films ($SiO_2$ films) are formed as an oxide film on the surfaces of the wafers 6.

In this case, an example of process conditions (oxidation process conditions) is as follows:

Process temperature (temperature inside the processing chamber): 500 to 1,000° C., Process pressure (pressure inside the processing chamber): 1 to 1,000 Pa, Oxygen gas supply flow rate supplied from main nozzle: 2,000 to 4,000 sccm, Hydrogen gas supply flow rate supplied from main nozzle: 0 to 500 sccm, Oxygen gas supply flow rate supplied from sub-nozzle (total flow rate): 1,000 to 3,000 sccm, and Hydrogen gas supply flow rate supplied from sub-nozzle (total flow rate): 1,500 to 2,000 sccm.

While maintaining the respective process conditions at constant values within the respective ranges, the oxidation process is performed on the wafers 6.

When the oxidation process of the wafers 6 is completed, the open-close valves 91a, 91b, 93a, 93b, 94a, 94b, 96a and 96b are closed, and the supply of the $O_2$ gas and the $H_2$ gas into the processing chamber 4 is stopped. Then, by vacuum-exhaust the inside of the reaction tube 10 or purging the inside of the reaction tube 10 with inert gas, residual gases inside the reaction tube 10 are removed. Subsequently, after the pressure inside the furnace is returned back to the atmospheric pressure and the temperature inside the furnace is decreased to a predetermined temperature, the boat 3 holding the processed wafers 6 is unloaded from the inside of the processing chamber 4, and the boat 3 is queued at a predetermined position until all the processed wafers 6 held in the boat 6 are cooled. When the processed wafers 6 held in the queued boat 3 are cooled down to a predetermined temperature, the processed wafers 6 are discharged by the substrate transfer device. In this way, a series of processes for oxidizing the wafers 6 are completed.

Hereinafter, the operation of the present invention will be described with reference to FIG. 13 to FIG. 15. The following description will be made on a case where $O_2$ gas is supplied at a certain flow rate (about several hundreds of sccm) together with $H_2$ gas from the vicinity of the gas ejection hole of the hydrogen sub-nozzle (hydrogen supply nozzle 8b) installed so as to correct the inter-wafer film thickness uniformity of the oxide films formed on the wafers. The process conditions are as follows: the process temperature is 850 to 950° C.; the process pressure is about 0.5 Torr; the flow rate of the $H_2$ gas supplied from the main nozzle is several hundreds of sccm; the flow rate of the $O_2$ gas supplied from the main nozzle is several thousands of sccm; and the flow rate of the $H_2$ gas supplied from the sub-nozzle is about 1,500 sccm.

Figure 13:
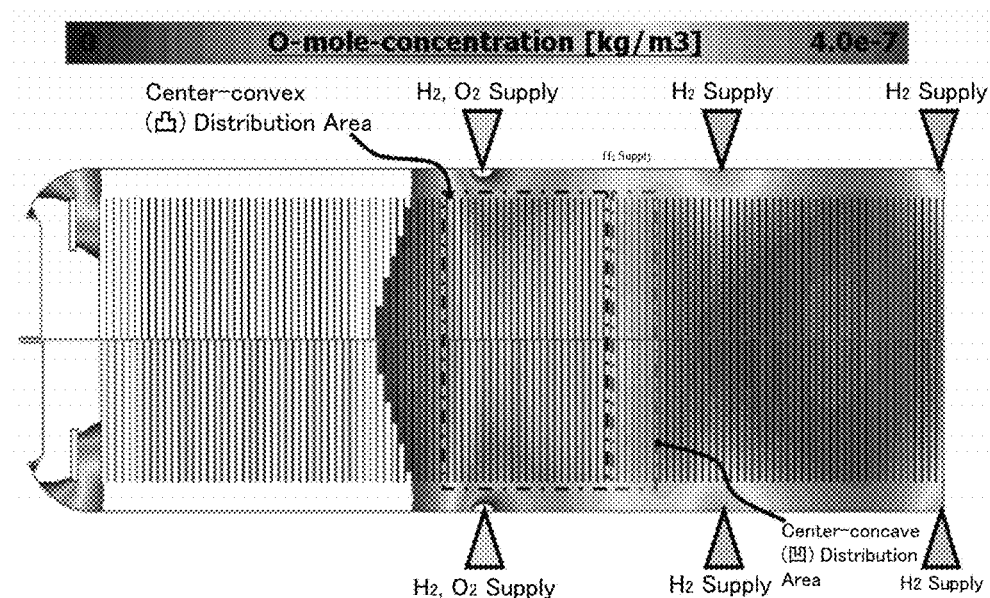
FIG. 13 is a view showing an atomic oxygen concentration distribution ($H_2$ gas and $O_2$ gas supply from sub-nozzles) as a result of CFD analysis.

FIG. 13 shows the analysis result of the reaction behavior in the gases and the wafer surfaces under those conditions (mole density distribution of atomic oxygen O inside the processing chamber). According to the result, the partial pressure of the atomic oxygen O is locally lowered in the vicinity that supplies the $H_2$ gas and the $O_2$ gas. However, as the $H_2$ gas and the $O_2$ gas infiltrate into the central part of the wafer due to concentration diffusion, the reaction to generate atomic oxygen O progresses, and the concentration of the atomic oxygen O increases toward the central part of the wafer. As described above, since the film thickness of the oxide film formed on the surface of the wafer depends on the concentration of the gas-phase atomic oxygen O, the intra-wafer film thickness distribution of the oxide film formed on the surface of the wafer in the vicinity that supplies the $H_2$ gas and the $O_2$ gas can be the center-convex (凸) distribution (during the processing of the bare wafer).

The effect is not limited to the vicinity that supplies the $H_2$ gas and the $O_2$ gas, but generates even in the upstream side and the downstream side relative to the supply point. In particular, the effect range is wide at the downstream side, and the effect reaches up to the lower side (downstream) of about 150 mm under the above-described process conditions. That is, if an arbitrary-amount supply point (gas ejection hole) of $H_2$ gas and $O_2$ gas is installed at a pitch of about 150 mm, the intra-wafer film thickness uniformity of the oxide film formed on the surface of the wafer with respect to the entire wafer arrangement area can be the center-convex (凸) distribution (during the processing of the bare wafer). For example, when assuming the vertical furnace where 100 to 150 sheets of wafers are stacked at a pitch of about 100 mm, it is necessary to install $H_2$ gas, $O_2$ gas supply points (gas ejection holes) at 6 to 10 locations. That is, it is necessary to install the gas ejection holes of the hydrogen sub-nozzles and the gas ejection holes of the oxygen sub-nozzles at 6 to 10 locations at a pitch of about 150 mm, respectively. At the oxidation furnace of FIG. 12, the gas ejection holes of the hydrogen sub-nozzles and the gas ejection holes of the oxygen sub-nozzles are installed at seven locations at a pitch of about 150 mm, respectively.

Figure 14:
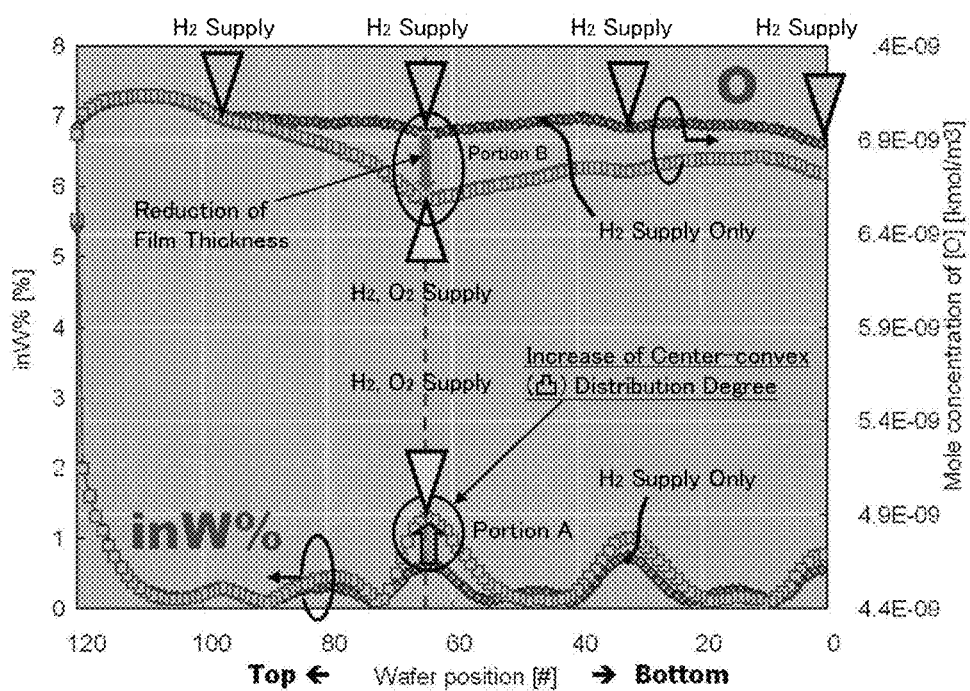
FIG. 14 is an analysis result of an atomic oxygen O concentration between surfaces of wafers and within surfaces of wafers, showing inter-wafer uniformity and intra-wafer uniformity of an atomic oxygen O concentration ($H_2$ gas and $O_2$ gas supply form sub-nozzles).
Figure 15:
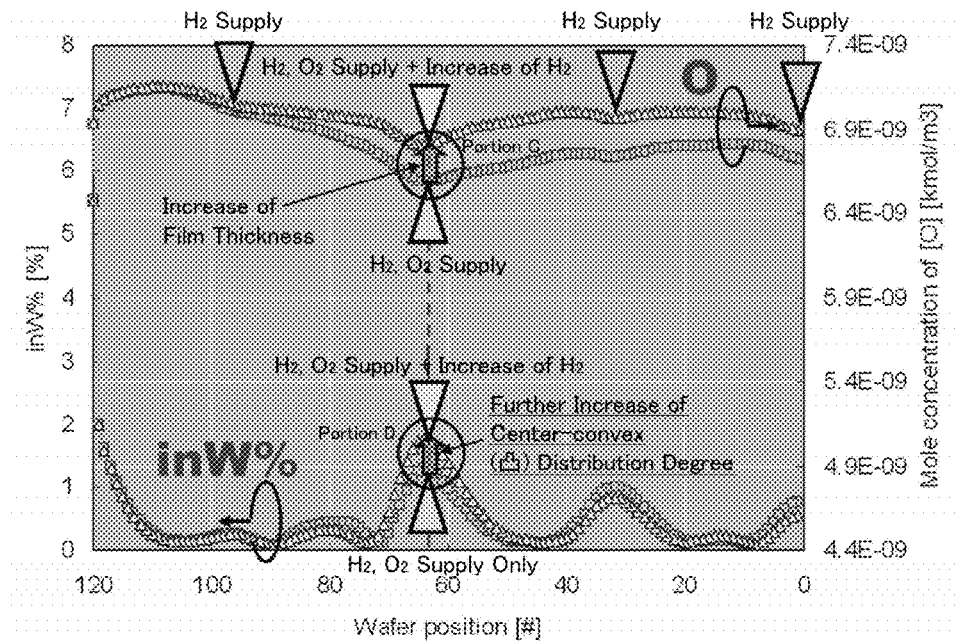
FIG. 15 is an analysis result of an atomic oxygen O concentration between surfaces of wafers and within surfaces of wafers, showing inter-wafer uniformity and intra-wafer uniformity of an atomic oxygen O concentration ($H_2$ gas and $O_2$ gas supply from sub-nozzles+increase of $H_2$ gas).

FIG. 14 shows the analysis result of the inter-wafer and intra-wafer concentrations of atomic oxygen O under the above-described process conditions. In FIG. 14, a rhombic point (◇) is a condition that the inter-wafer film thickness uniformity of the oxide films formed on the wafers is corrected by the halfway supply of $H_2$ gas only. In FIG. 14, a square point (□) is a condition that $O_2$ gas is further added to the position indicated by a broken line in the drawing under the condition that corrects the inter-wafer film thickness uniformity by the halfway supply of $H_2$ gas only (condition of the rhombic point (◇)). As described above, the addition of the $O_2$ gas increases the center-convex (凸) distribution degree of the intra-wafer film thickness distribution of the oxide film formed on the wafer (portion A of the drawing). Meanwhile, there occurs the phenomenon that the film thickness is reduced in the vicinity where the $O_2$ gas is added (portion B of the drawing), and thus, the inter-wafer film thickness uniformity of the oxide films formed on the wafers is deteriorated.

A means for avoiding this problem will be described with reference to FIG. 15. A square point (□) of FIG. 15 is the same condition as the square point (□) of FIG. 14 (condition that the $O_2$ gas is further added to the condition that the inter-wafer film thickness uniformity is corrected by the halfway supply of the $H_2$ gas only). In FIG. 15, a triangular point (△) is a condition that $H_2$ gas is further added to the position indicated by a broken line in the drawing under the condition of the square point (□) (a flow rate of $H_2$ gas is increased). By further adding the $H_2$ gas to the position where the $O_2$ gas is added (by increasing the flow rate of the $H_2$ gas), it is possible to increase the film thickness of the position where the film thickness is reduced due to the addition of the $O_2$ gas (portion C of the drawing). Also, regarding the intra-wafer film thickness uniformity, the center-convex (凸) distribution degree of the intra-wafer film thickness distribution is more increased by further adding the $H_2$ gas (by increasing the flow rate of the $H_2$ gas).

The control effect of the intra-wafer film thickness uniformity by the addition of the $O_2$ gas as described above (increase effect of the center-convex (凸) distribution degree of the intra-wafer film thickness distribution), the film thickness increase effect, and the control effect of the intra-wafer film thickness uniformity (further increase effect of the center-convex (凸) distribution degree of the intra-wafer film thickness distribution) by the addition of the $H_2$ gas operate around the gas supply point. In order for efficient combination of these effects, it is preferable that the $O_2$ gas and the $H_2$ gas are supplied from the substantially same height. That is, it is preferable that the height of the $H_2$ gas supply point (gas ejection hole) is matched with the height of the $O_2$ gas supply point (gas ejection hole). In the oxidation furnace of FIG. 12, the plurality of gas ejection holes provided in the hydrogen sub-nozzle (hydrogen supply nozzle 8b) and the plurality of gas ejection holes provided in the oxygen sub-nozzle (oxygen supply nozzle 8a) are installed at the same heights, respectively. That is, the number and the arrangement pitch of the gas ejection holes provided in the hydrogen supply nozzle 8b are equal to the number and the arrangement pitch of the gas ejection holes provided in the oxygen supply nozzle 8a, and the gas ejection holes provided in the hydrogen supply nozzle 8b and the gas ejection holes provided in the oxygen supply nozzle 8a are installed at the same heights, respectively, such that they are in 1:1 correspondence with one another. Therefore, the control of the intra-wafer film thickness uniformity is possible while the inter-wafer film thickness uniformity is maintained (the intra-wafer film thickness distribution can be actively the center-convex (凸) distribution), and it is possible to prevent the prominent center-concave (凹) distribution of the intra-wafer film thickness distribution having occurred in the processing of the wafer with deep recessed patterns such as STI (wafer with large consumption of atomic oxygen O).

Hereinafter, details about the control operation of the intra-wafer film thickness uniformity by the addition of the $O_2$ gas and the film thickness increase effect by the addition of the $H_2$ gas will be described with reference to FIG. 16 and FIG. 17.

Figure 1:
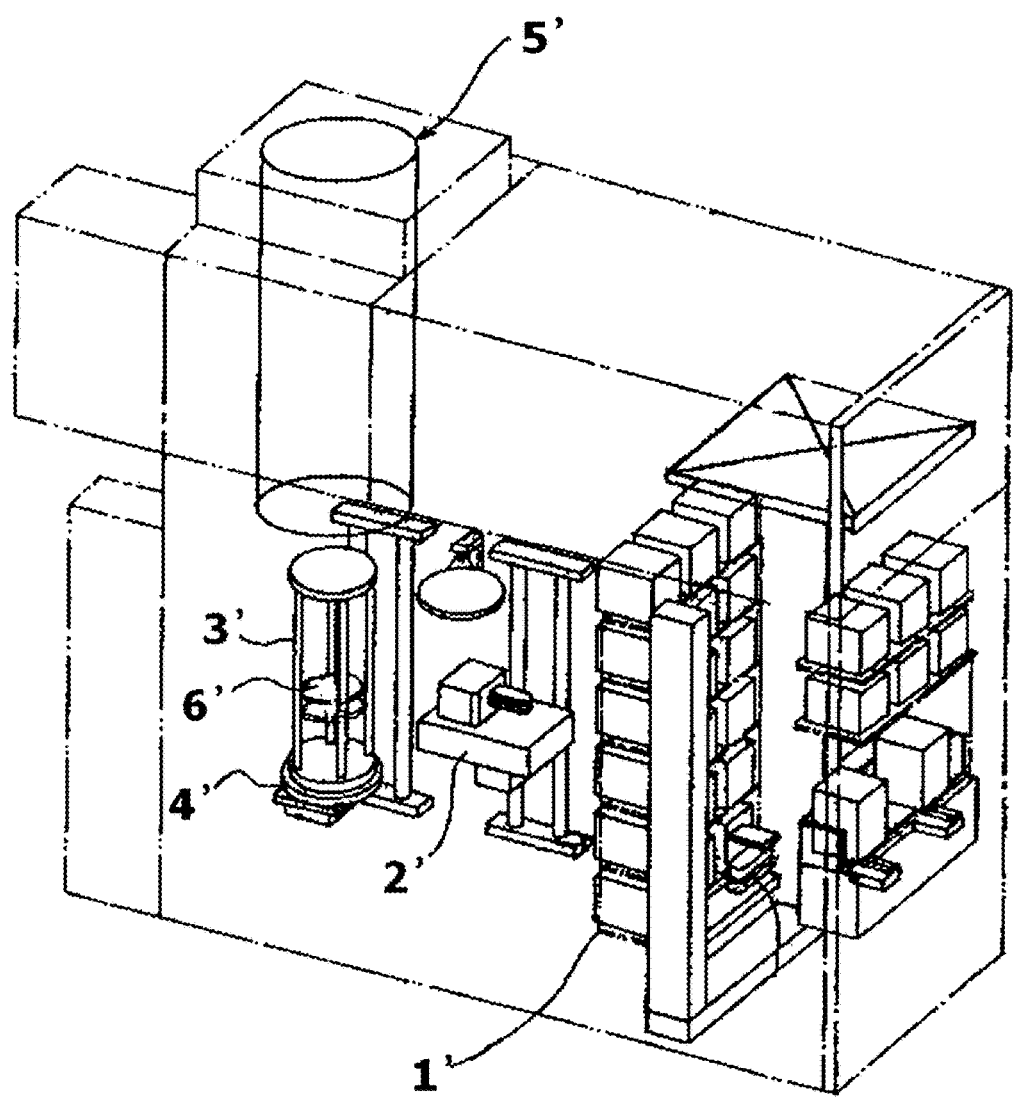
FIG. 1 is a perspective view showing an overall configuration of a semiconductor manufacturing apparatus.
Figure 2:
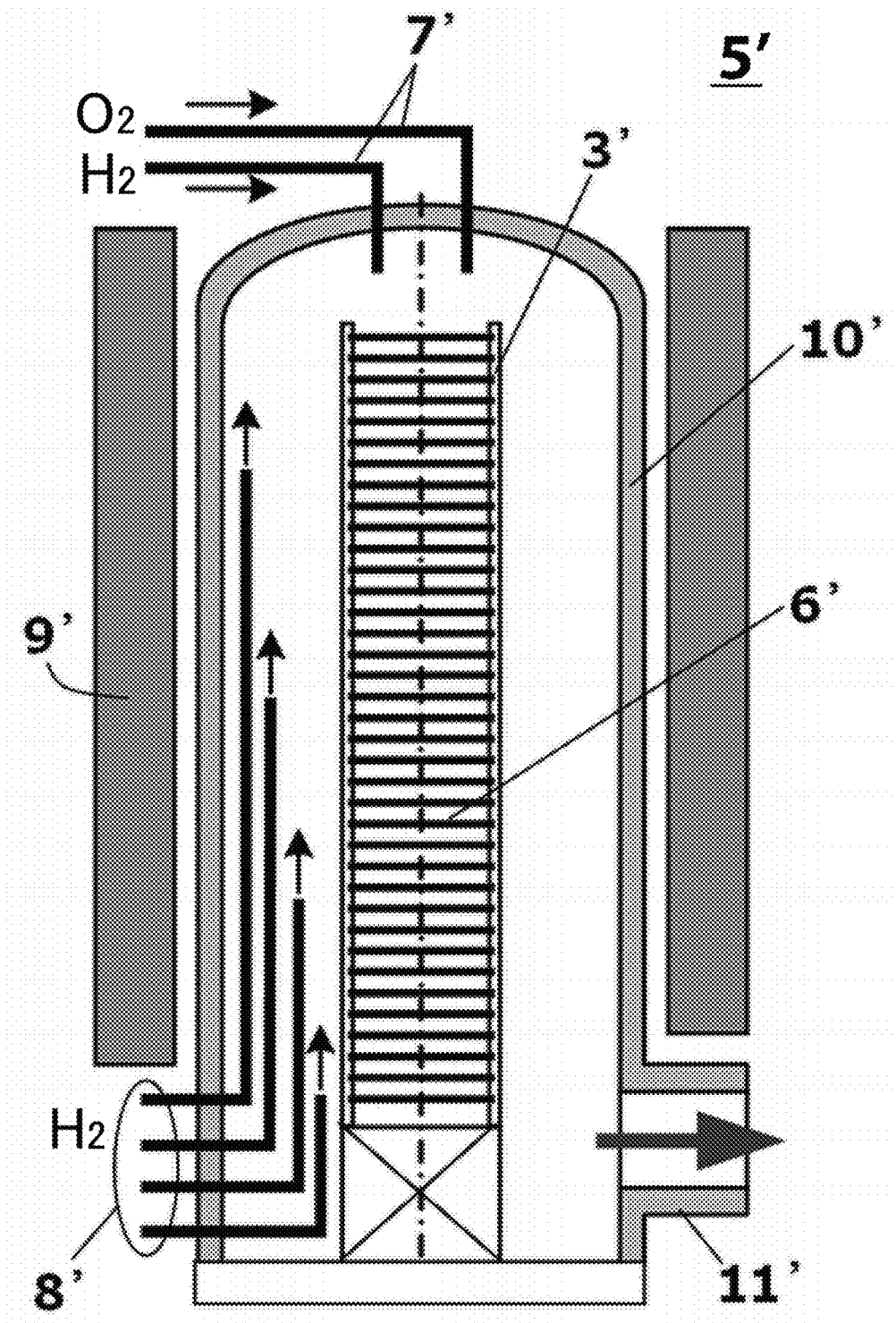
FIG. 2 is a schematic sectional view showing a configuration of a heat-treating furnace of the semiconductor manufacturing apparatus.
Figure 3:
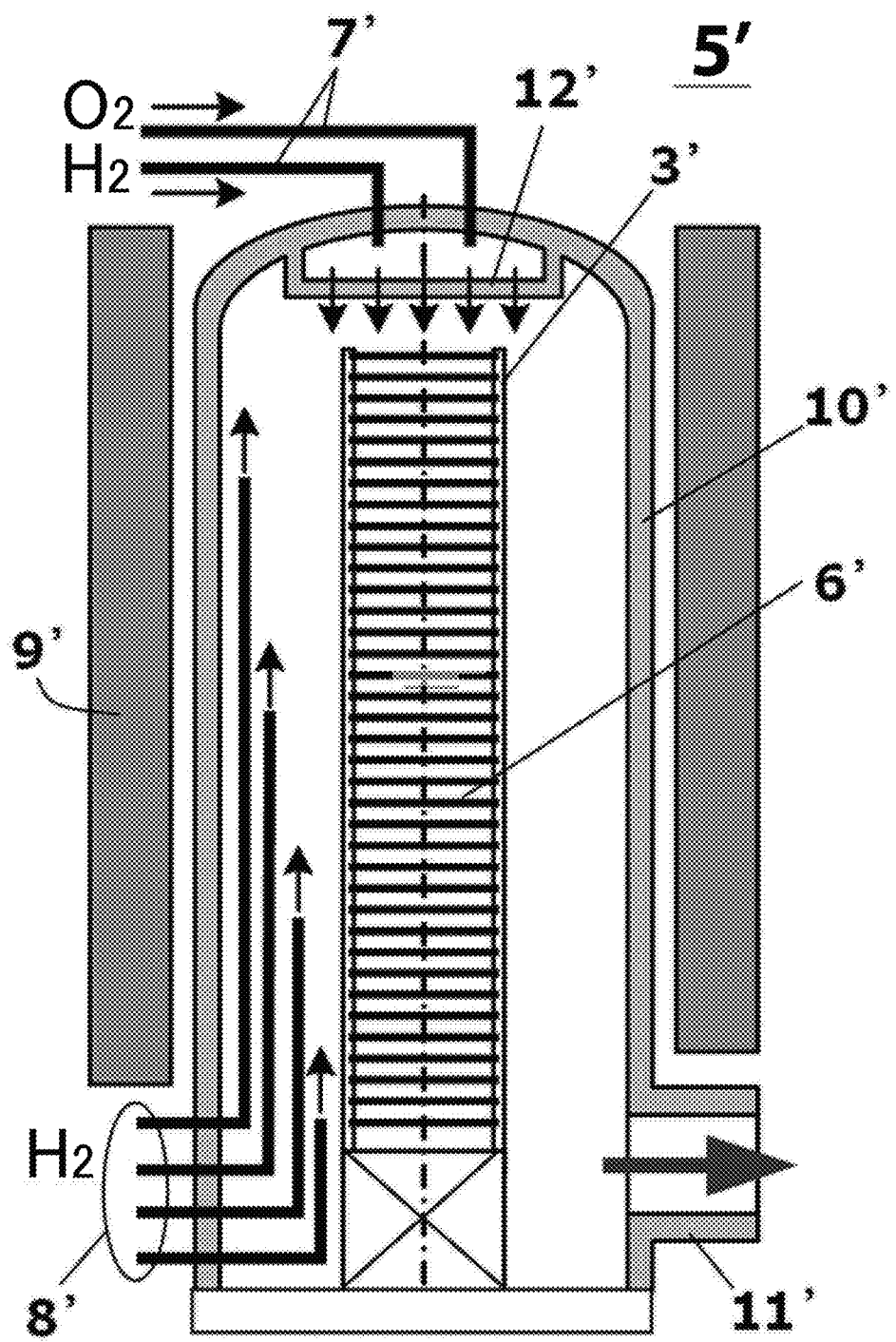
FIG. 3 is a schematic sectional view showing another configuration of a heat-treating furnace of the semiconductor manufacturing apparatus.
Figure 4:
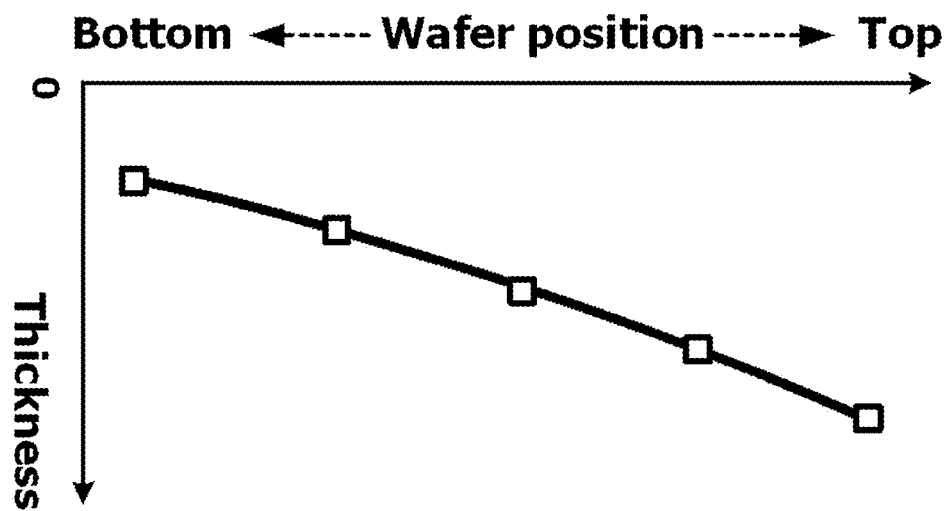
FIG. 4 is a graph showing a film thickness distribution when a loading effect occurs.
Figure 5:
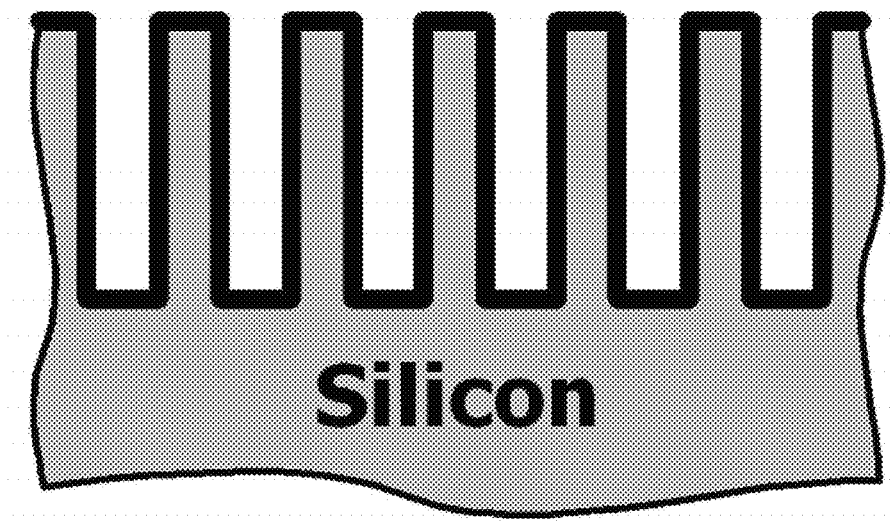
FIG. 5 is a schematic sectional view of a wafer where patterns such as STI are formed.
Figure 6:
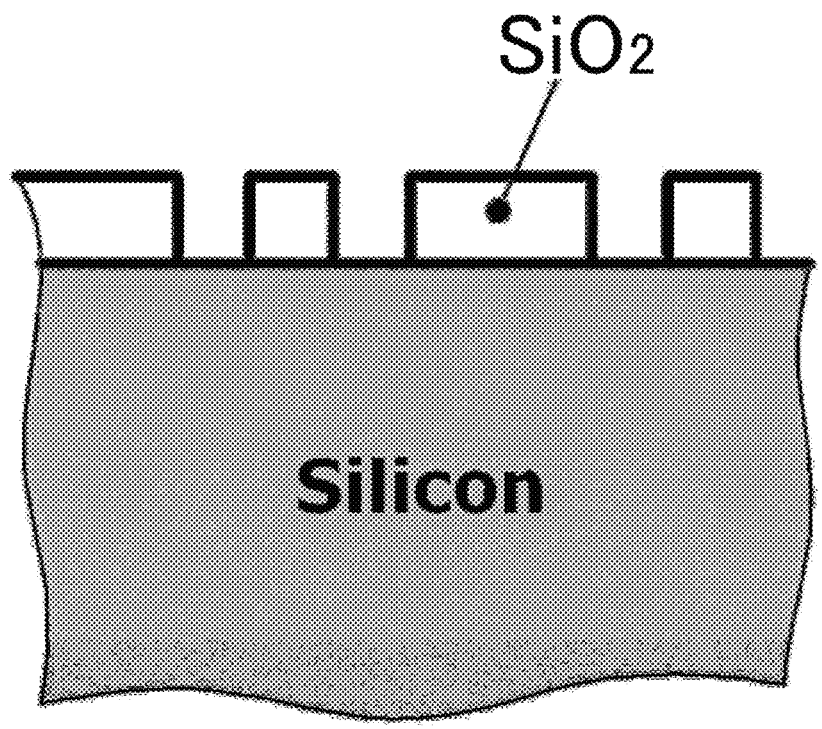
FIG. 6 is a schematic sectional view of a wafer whose surface is partially covered with an oxide film.
Figure 7:
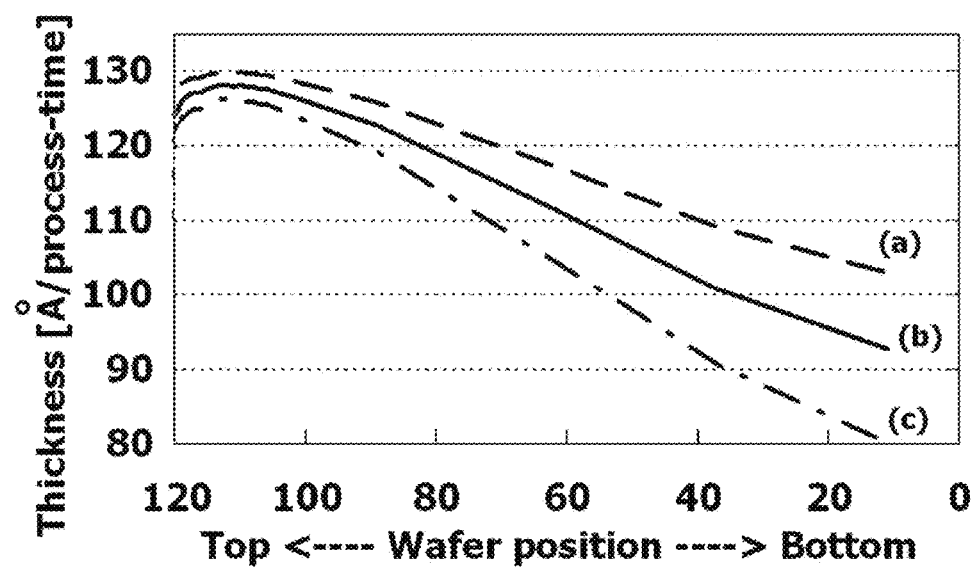
FIG. 7 is a film thickness distribution map showing pattern dependency of a loading effect.
Figure 8:
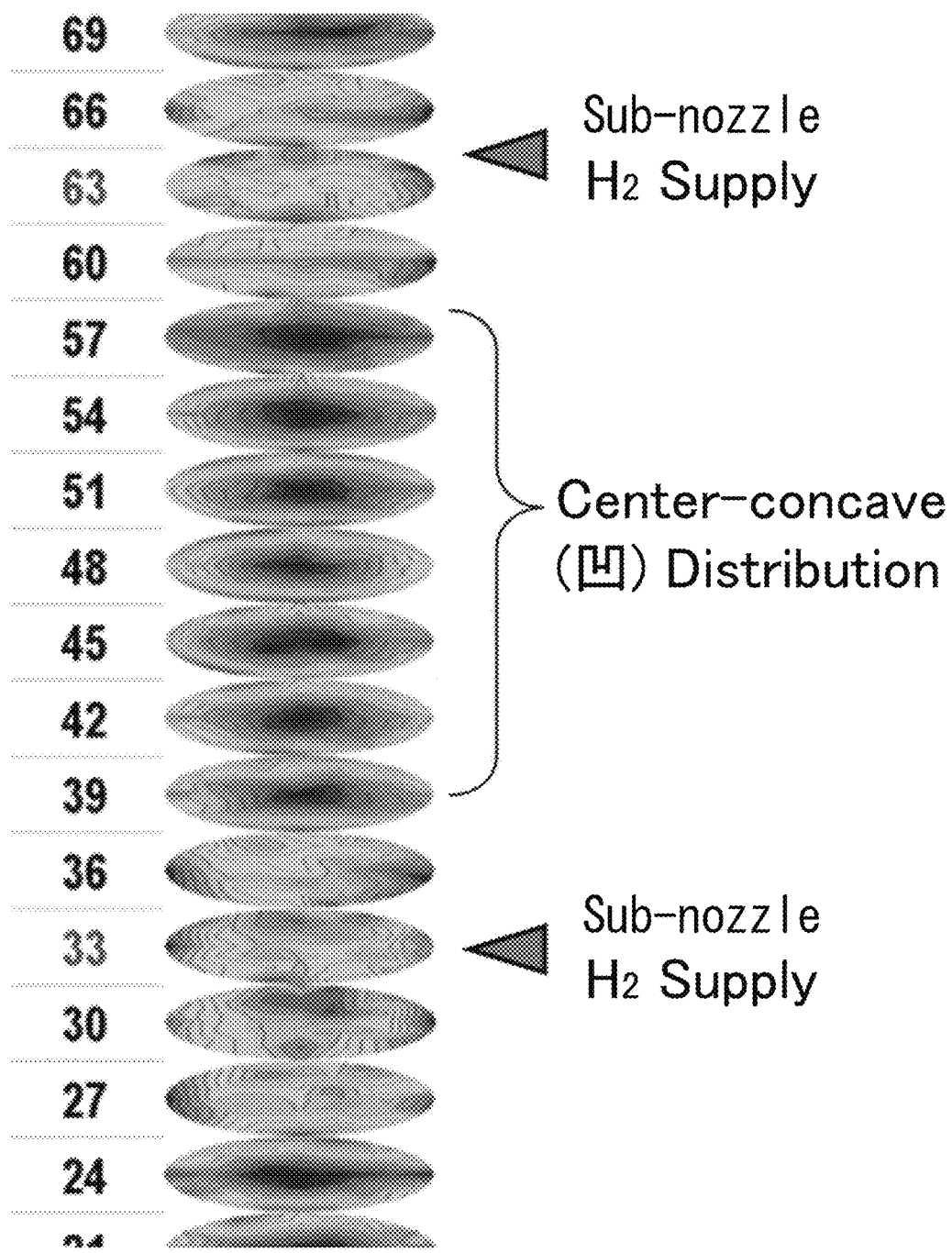
FIG. 8 is a view showing a relationship between a film thickness map and positions of sub-nozzles.
Figure 9:
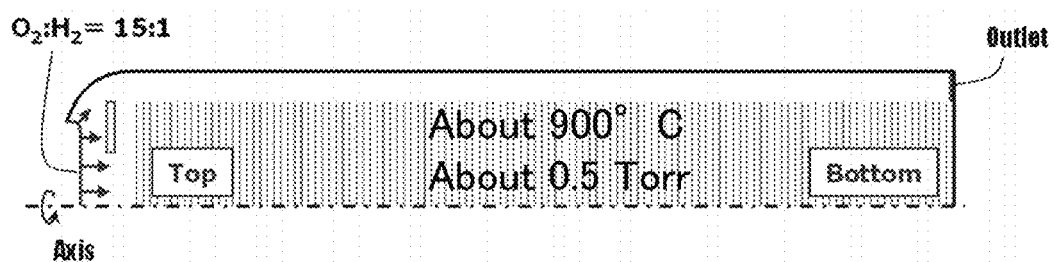
FIG. 9 is a view showing a calculation area considered by a CFD analysis.
Figure 10:
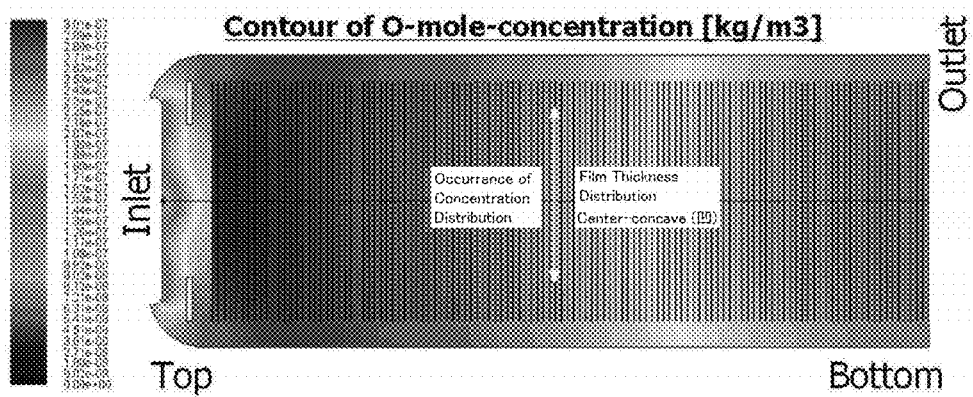
FIG. 10 is a view showing an atomic oxygen concentration distribution (no gas supply from sub-nozzles) as a result of CFD analysis.
Figure 11:
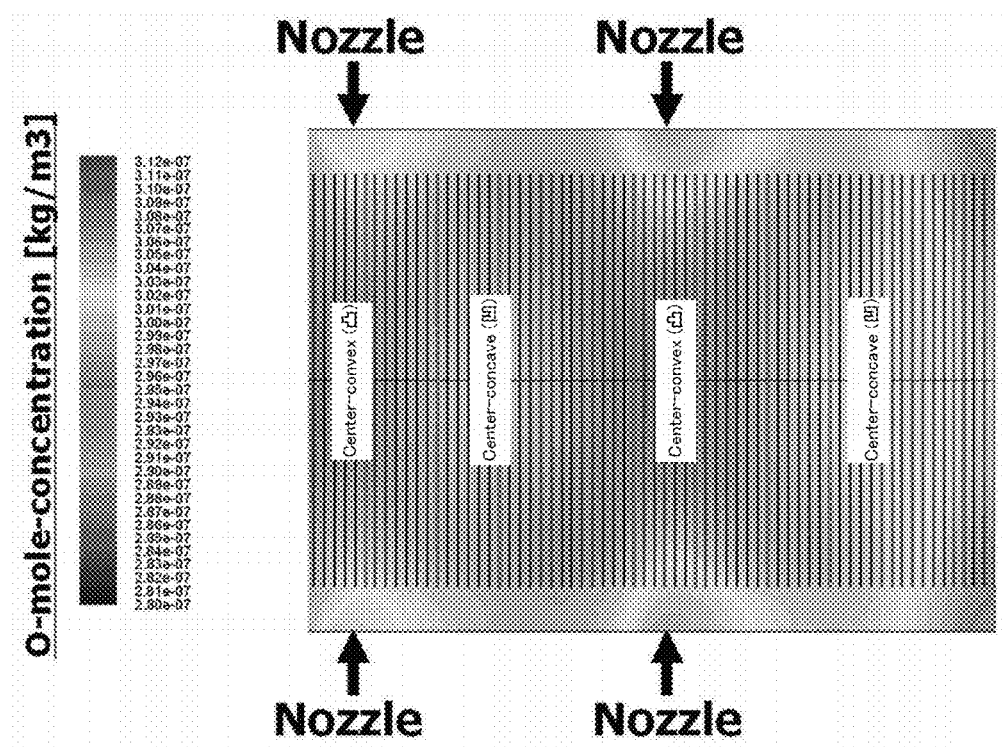
FIG. 11 is a view showing an atomic oxygen concentration distribution ($H_2$ gas supply from sub-nozzles) as a result of CFD analysis.
Figure 16:
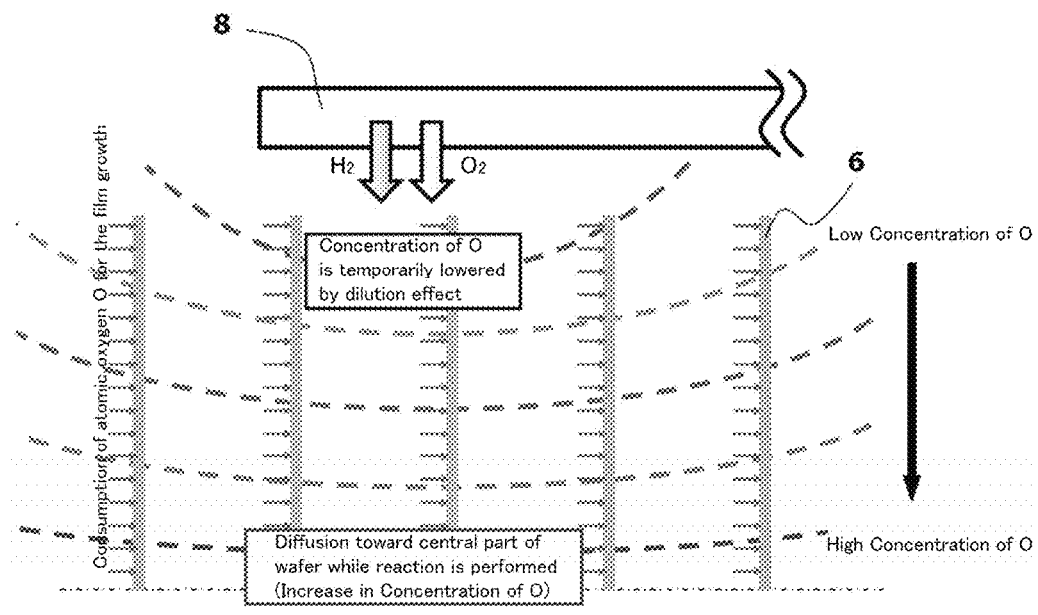
FIG. 16 is a view schematically showing an atomic oxygen O concentration distribution in the vicinity of $H_2$ gas and $O_2$ gas supply points of sub-nozzles.

FIG. 16 schematically shows the concentration distribution of atomic oxygen O in the vicinity of the supply points when $H_2$ gas and $O_2$ gas are supplied from the hydrogen sub-nozzle (hydrogen supply nozzle 8b) and the oxygen sub-nozzle (oxygen supply nozzle 8a), respectively. In FIG. 16 and FIG. 17, the hydrogen sub-nozzle (hydrogen supply nozzle 8b) and the oxygen sub-nozzle (oxygen supply nozzle 8a) are overlappingly displayed, and both the sub-nozzles are collectively represented by a sub-nozzle 8. Since the pressure of the processing chamber is constant at about 0.5 Torr, the concentration (partial pressure) of the atomic oxygen O in the vicinity of the $H_2$ gas and $O_2$ gas supply points is lowered by a dilution effect. Therefore, contrary to the behavior of the area where no gas is supplied from the sub-nozzle according to the prior art (as shown in FIG. 10, the concentration of the atomic oxygen O is lowered over the central part of the wafer by the concentration diffusion from mainstream flowing down between the edge part of the wafer and the inner wall of the reaction tube and by the consumption of the atomic oxygen O on the surface of the wafer), the concentration of the atomic oxygen O is lowered at the edge part of the wafer, and thus, the concentration of the atomic oxygen O tends to be increased by the weakening of the dilution effect over the central part of the wafer and the progress of the reaction to generate the atomic oxygen O. Finally, the balance is formed in such a state that the consumption of the atomic oxygen O for the film growth on the surface of the wafer is added to this phenomenon.

Figure 17A:
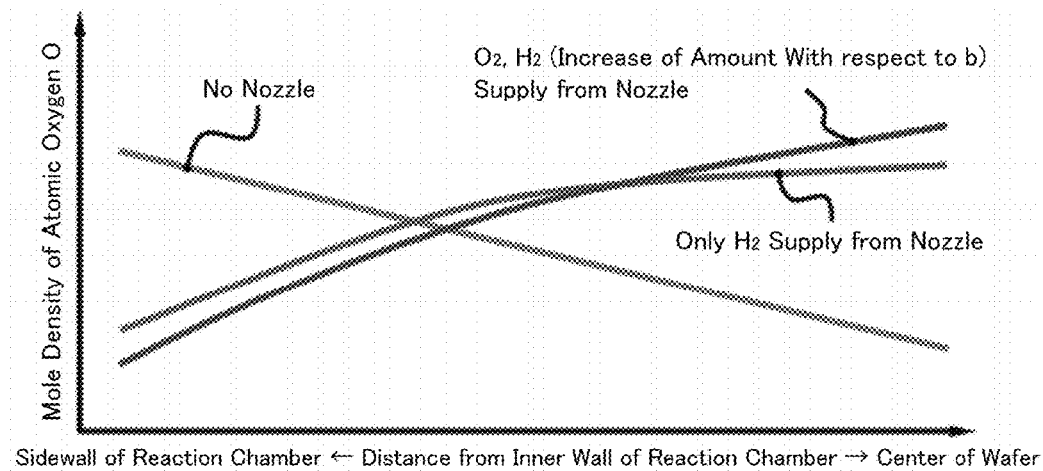
FIG. 17A, FIG. 17B, FIG. 17C, and FIG. 17D are views schematically showing atomic oxygen O mole concentration on wafer surfaces and film thickness cross-section maps.
Figure 17B:
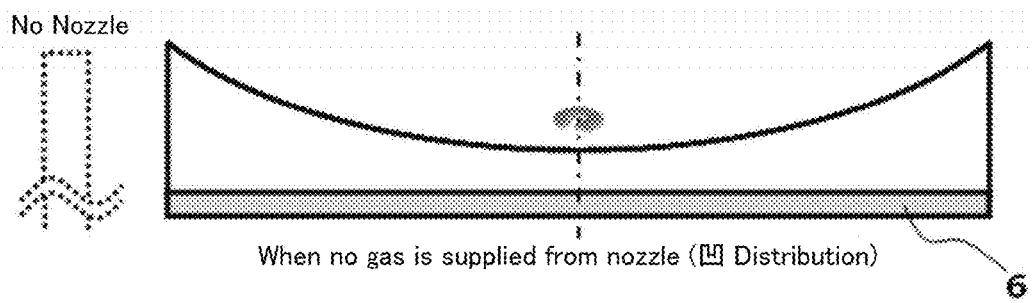
Figure 17C:
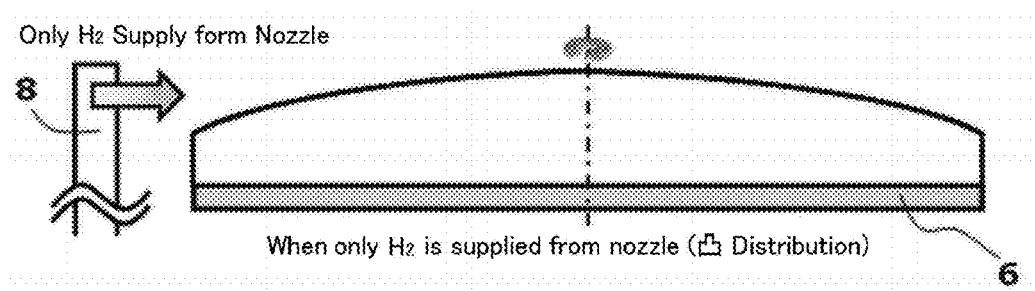
Figure 17D:
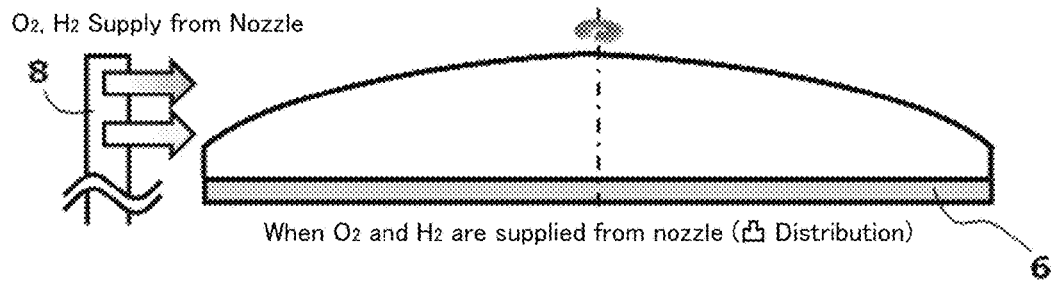

FIG. 17A schematically shows the mole density of the atomic oxygen O in the case of FIG. 17B, FIG. 17C, and FIG. 17C. FIG. 17B schematically shows the film thickness map (sectional view) on the surface of the wafer (assuming the bare wafer film-forming process) when no gas is supplied from the sub-nozzle (no nozzle). FIG. 17C schematically shows the film thickness map (sectional view) on the surface of the wafer (assuming the bare wafer film-forming process) when only $H_2$ gas is supplied from the sub-nozzle (only $H_2$ gas supply from the nozzle). FIG. 17D schematically shows the film thickness map (sectional view) on the surface of the wafer (assuming the bare wafer film-forming process) when $H_2$ gas and $O_2$ gas are supplied from the sub-nozzle ($O_2$, $H_2$ supply from the nozzle with an increased amount of $H_2$ with respect to the case of FIG. 17C). When no gas is supplied from the sub-nozzle, as described above, the concentration diffusion from the periphery part of the wafer is dominant, and also, the concentration of the atomic oxygen O is high at the periphery part of the wafer and gets lower over the central part of the wafer by the consumption of the atomic oxygen O on the surface of the wafer. As shown in FIG. 17B, the intra-wafer film thickness distribution becomes the center-concave (凹) distribution. When only $H_2$ gas is supplied by the sub-nozzle, the concentration (partial pressure) of the atomic oxygen O is lowered as much as the added $H_2$ gas in the vicinity of the supply point, and thus, it is possible to suppress the concentration of the atomic oxygen O from increasing at the periphery part of the wafer. As the reaction to generate the atomic oxygen O progresses over the central part of the wafer ($H_2$ gas addition effect), the concentration of the atomic oxygen O gets higher toward the central part of the wafer. As shown in FIG. 17C, the intra-wafer film thickness uniformity becomes the center-convex (凸) distribution. When $H_2$ gas and $O_2$ gas are supplied by the sub-nozzle, the concentration (partial pressure) of the atomic oxygen O is further lowered as much as the added $H_2$ gas and $O_2$ gas in the vicinity of the supply point, and thus, it is possible to suppress the concentration of the atomic oxygen O from increasing at the periphery part of the wafer. In addition, like the case where only $H_2$ gas is supplied over the central part of the wafer, as the reaction to generate the atomic oxygen O progresses over the central part of the wafer ($H_2$ gas addition effect), the concentration of the atomic oxygen O gets higher toward the central part of the wafer. Moreover, since a large amount of $H_2$ gas is supplied so as to correct the film thickness reduced by the addition of the $O_2$ gas, an amount of atomic oxygen O generated over the central part of the wafer becomes larger than when only $H_2$ gas is supplied. Consequently, as shown in FIG. 17D, the center-convex (凸) distribution degree can be stronger than when only $H_2$ gas is supplied. That is, it can be said that the control range of the film thickness distribution is wider than when only $H_2$ gas is supplied.

As described above, by supplying $H_2$ gas and $O_2$ gas halfway, the intra-wafer film thickness uniformity can be improved (controlled) by preventing the prominent center-concave (凹) distribution having occurred in the processing of the wafer with deep recessed patterns such as STI (wafer with large consumption of atomic oxygen O), while maintaining the inter-wafer film thickness uniformity of the oxide films formed on the stacked wafers.

In the above-described embodiment, the $O_2$ gas supplied from the sub-nozzle mainly functions to dilute the concentration of the atomic oxygen O in the vicinity of the supply point. Therefore, the same effect can be obtained even if supplying inert gas (for example, $N_2$, He, Ne, Ar, Xe, etc.) having no influence on the wafer processing, instead of supplying $O_2$ gas from the sub-nozzle. That is, $O_2$ gas and $H_2$ gas may be supplied from the oxygen supply nozzle 7a and the hydrogen supply nozzle 7b constituting the main nozzle, respectively, and $H_2$ gas may be supplied from the hydrogen sub-nozzle (hydrogen supply nozzle 8b), and inert gas may be supplied from the oxygen sub-nozzle (oxygen supply nozzle 8a).

Furthermore, while the case of using the oxygen gas as the oxygen-containing gas and the case of using the hydrogen gas as the hydrogen-containing gas have been described in the above-described embodiment, at least one gas selected from the group consisting of oxygen ($O_2$) gas and nitrous oxide ($N_2O$) gas may be used as the oxygen-containing gas, and at least one gas selected from the group consisting of hydrogen (H$_2$) gas, ammonia (NH$_3$) gas and methane (CH$_4$) gas may be used as the hydrogen-containing gas.

Second Embodiment

Next, a second embodiment of the present invention will be described.

While the example in which the oxygen sub-nozzle (oxygen supply nozzle 8*a*) is configured by the plurality of nozzles (multi nozzles) each having a different length has been described in the above-described first embodiment, the oxygen supply nozzle 8*a* may also be configured by a single nozzle (multi-hole nozzle) having a plurality of gas ejection holes. Hereinafter, an example in which the oxygen sub-nozzle is configured by a single multi-hole nozzle will be described as the second embodiment.

Figure 18:
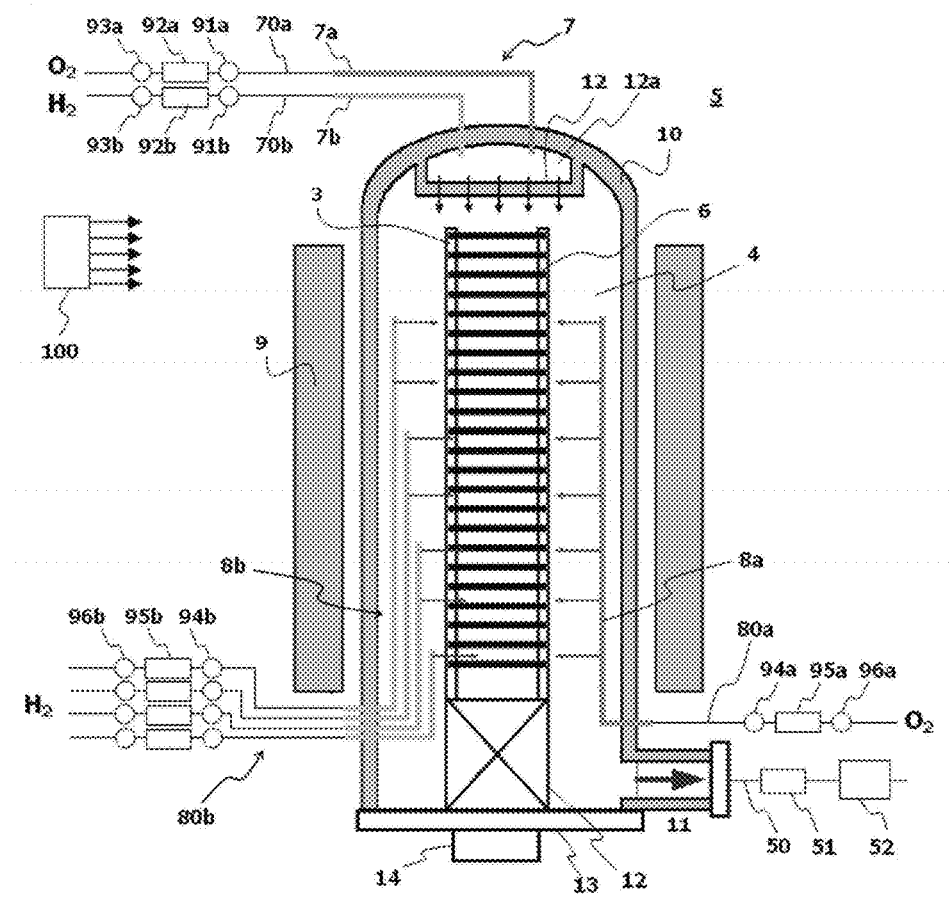
FIG. 18 is a schematic sectional view showing a configuration of a heat-treating furnace in accordance with a second embodiment of the present invention.

As a substrate processing apparatus in accordance with a second embodiment of the present invention, a batch-type vertical semiconductor manufacturing apparatus (oxidation apparatus) will be described with reference to FIG. 18. FIG. 18 is a schematic sectional view showing a configuration example of a heat-treating furnace (oxidation furnace) relevant to the second embodiment.

Only difference between the oxidation furnace (FIG. 18) of the second embodiment and the oxidation furnace (FIG. 12) of the first embodiment is the configuration of the sub oxygen gas supply system including the oxygen supply nozzle 8*a*. The other configurations are the same as the first embodiment. In this embodiment, the sub oxygen gas supply system is mainly provided with a single oxygen supply nozzle 8*a* having a plurality of gas ejection holes, an oxygen supply pipe 80*a* configured by a single pipe connected to the oxygen supply nozzle 8*a*, an open-close valve 94*a*, a mass flow controller 95*a*, and an open-close valve 96*a* installed in the oxygen supply pipe 80*a*. In FIG. 18, arrows extending from the oxygen supply nozzle 8*a* toward the wafers 6 represent O$_2$ gas ejection directions from the respective gas ejection holes, and root parts of the arrows represent the respective gas ejection holes. This embodiment is substantially similar to the first embodiment in that the plurality of gas ejection holes provided in the oxygen supply nozzle 8*a* and the plurality of gas ejection holes provided in the hydrogen supply nozzle 8*b* are installed at the same heights, respectively, and the number (seven) of the gas ejection holes provided in the oxygen supply nozzle 8*a* is equal to the number (seven) of the gas ejection holes provided in the hydrogen supply nozzle 8*b*. In FIG. 18, the same reference numerals as those of FIG. 12 are assigned to the substantially same elements as those of FIG. 12 and their description will be omitted.

In this embodiment, a first nozzle is configured by the hydrogen supply nozzle 8*b* provided with a plurality of nozzles each having a different length, and a first gas ejection hole is configured by a plurality of gas ejection holes provided in the hydrogen supply nozzle 8*b*. In addition, a second nozzle is configured by the oxygen supply nozzle 8*a* provided with a single multi-hole nozzle, and a second gas ejection hole is configured by the plurality of gas ejection holes provided in the oxygen supply nozzle 8*a*. In this embodiment, while the gas ejection holes may be configured by a plurality of holes having the same diameter, they may also be configured by a plurality of holes each having a different diameter so that O$_2$ gas (dilution gas) is ejected from the gas ejection holes at a uniform flow rate.

According to this embodiment, the same effect as the first embodiment can obtained, and moreover, the apparatus configuration can be simplified and the cost can be down.

Third Embodiment

Next, a third embodiment of the present invention will be described.

Figure 19:
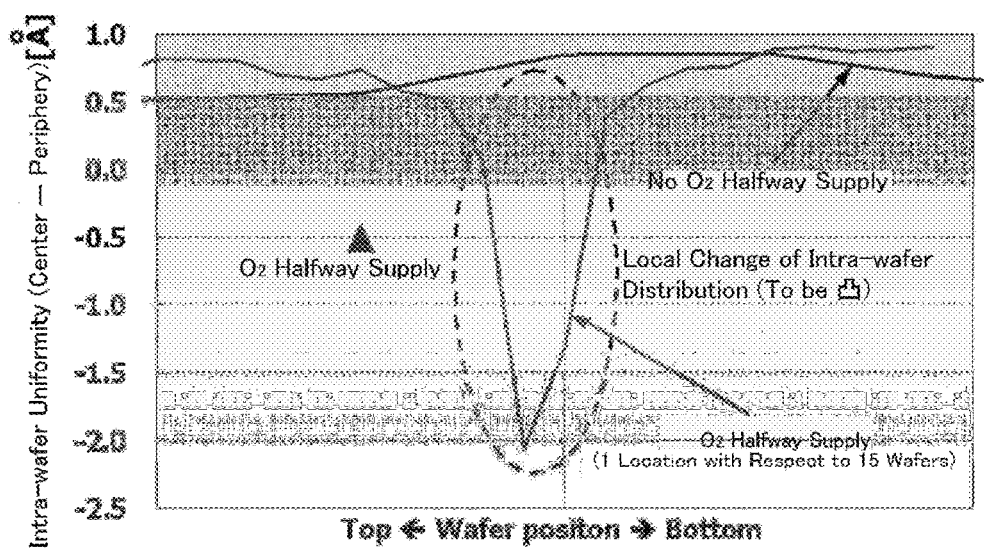
FIG. 19 is a view showing an experimental result of an intra-wafer film thickness uniformity when an oxidation process is performed in such a state that an arrangement pitch of $O_2$ gas supply points is larger than an arrangement pitch of wafers ($O_2$ gas supply points are formed at seven locations).

In the oxidation furnaces described above in the first and second embodiments, the arrangement pitch of the gas ejection holes provided in the oxygen sub-nozzle (oxygen supply nozzle 8*a*) is greater than the wafer arrangement pitch (for example, about 150-mm pitch), and the O$_2$ gas ejection holes (supply direction) are directed toward the wafers. However, in this case, as shown in FIG. 19, the inventors found that there were cases that the intra-wafer film thickness distribution became extremely center-convex (凸) due to the influence of the O$_2$ gas flow (inertia). That is, the inventors found that the intra-wafer film thickness distribution improvement (center-convex (凸) formation) effects were different in the vicinity of the O$_2$ gas supply point and the other areas. Regarding this, the inventors found that if the gas ejection holes provided in the oxygen sub-nozzle (oxygen supply nozzle 8*a*) were installed as many as at least the process wafers so that they were at least in 1:1 correspondence with the plurality of process wafers, the intra-wafer film thickness uniformity could be improved by controlling the reaction such that atomic oxygen O was generated much more at the central part of the process wafer, while preventing the local intra-wafer film thickness distribution tendency change (center-convex (凸) formation). In this specification, for convenience's sake, a product wafer as a product substrate to be processed is simply referred to as a wafer or a process wafer. Likewise, in this embodiment, a wafer or a process wafer refers to a product wafer. Hereinafter, explanation will be given on an example, as a third embodiment, in which the gas ejection holes of the oxygen sub-nozzle are installed as many as at least the process wafers (product wafer) so that they are at least in 1:1 correspondence with the plurality of process wafers.

Figure 20:
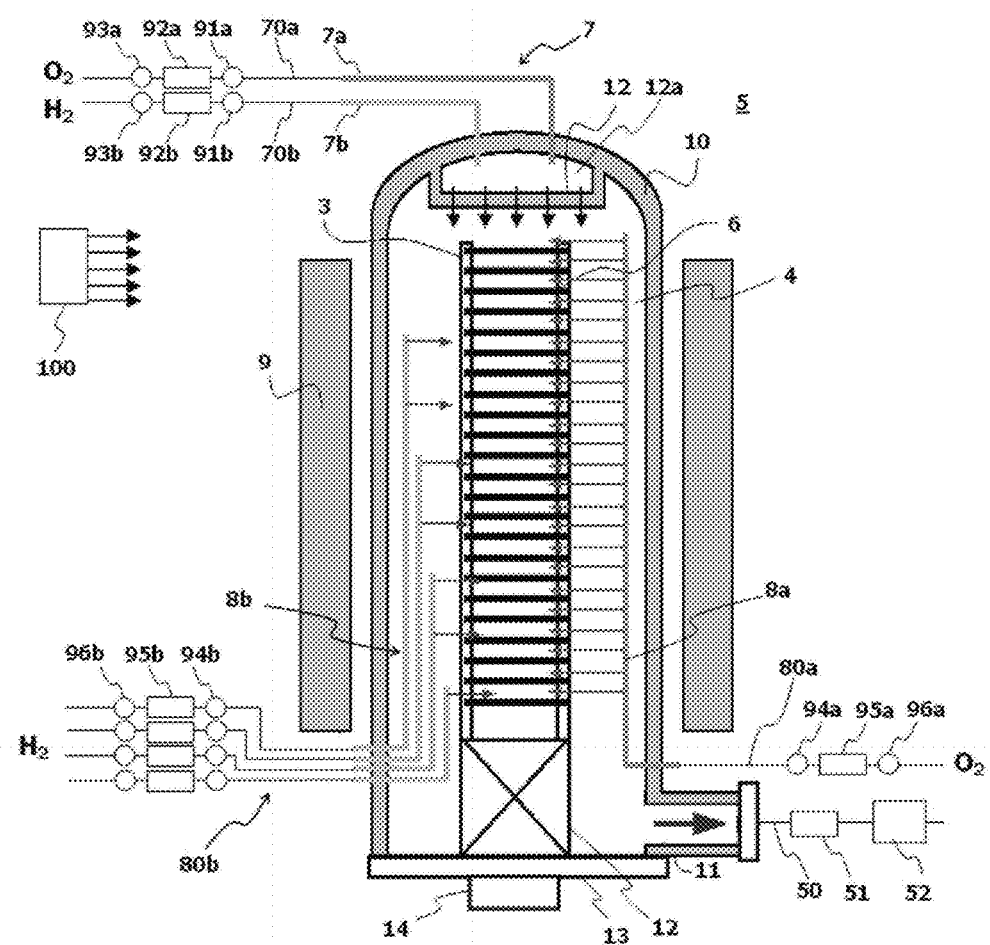
FIG. 20 is a schematic sectional view showing a configuration of a heat-treating furnace in accordance with a third embodiment of the present invention.

As a substrate processing apparatus in accordance with a third embodiment of the present invention, a batch-type vertical semiconductor manufacturing apparatus (oxidation apparatus) will be described with reference to FIG. 20. FIG. 20 is a schematic sectional view showing a configuration example of a heat-treating furnace (oxidation furnace) relevant to the third embodiment.

Only difference between the oxidation furnace (FIG. 20) of the third embodiment and the oxidation furnace (FIG. 18) of the second embodiment is the configuration of the oxygen supply nozzle 8*a*. The other configurations are the same as the second embodiment. In this embodiment, the oxygen supply nozzle 8*a* is provided with a single nozzle (multi-hole nozzle) having a plurality of gas ejection holes and extends along the inner wall of the sidewall of the reaction tube 10 until it reaches the top process wafer. That is, the oxygen supply nozzle 8*a* extends over the entire wafer arrangement area. In FIG. 20, arrows extending from the oxygen supply nozzle 8*a* toward the wafers 6 represent O$_2$ gas ejection directions from the respective gas ejection holes, and root parts of the arrows represent the respective gas ejection holes. That is, in order to uniformly supply O$_2$ gas to each of the process wafers, the oxygen supply nozzle 8*a* is provided with as many gas ejection holes as at least the process wafers so that the gas ejection holes are in 1:1 correspondence with at least the plurality of process wafers. For example, when the number of the process wafers is 120 sheets, at least 120 gas ejection holes are installed so that they correspond to at least the respective process wafers. Moreover, for example, when side dummy wafers are arranged above and under the process wafers, and the number of upper dummy wafers, process wafers, and lower dummy wafers is 10 sheets, 100 sheets, and 10 sheets, respectively, at least 100 gas ejection holes are installed so that they correspond to at least the 100 process wafers. In addition to the configuration in which as many gas ejection holes as the process wafers are installed so that they correspond to the respective process wafers, the gas ejection holes may be installed at locations that do not correspond to the process wafers, that is, areas other than the wafer arrangement area. For example, the gas ejection holes may be installed in an area corresponding to a dummy wafer arrangement area where the above-described side dummy wafers are arranged, or an area above or under the corresponding area. When the gas ejection holes are installed in the area corresponding to the dummy wafer arrangement area, it is preferable that as many gas ejection holes as the dummy wafers are installed so that they correspond to the respective dummy wafers in the region adjacent to at least the process wafers. In this way, the flow of the $O_2$ gas to the dummy wafers in the region adjacent to the process wafers may be made to be equal to the flow of the $O_2$ gas to the process wafers, and may be made not to disturb the flow of gas to the process wafers disposed in the vicinity of the dummy wafers. The gas ejection holes are configured by relatively small holes so that $O_2$ gas is ejected to the respective process wafers at a uniform flow rate. The oxygen supply nozzle 8a is configured by, for example, a multi-hole nozzle in which as many holes of about φ 0.5-1 mm as the process wafers are installed in a pipe of about φ 10-20 mm. The oxygen supply nozzle 8a may be configured to supply $O_2$ gas uniformly to all the process wafers, and may be configured by a plurality of nozzles each having a different length, just like in the first embodiment. In FIG. 20, the same reference numerals as those of FIG. 12 and FIG. 18 are assigned to the substantially same elements as those of FIG. 12 and FIG. 18 and their description will be omitted.

In this embodiment, a first nozzle is configured by the hydrogen supply nozzle 8b provided with a plurality of nozzles each having a different length, and a first gas ejection hole is configured by a plurality of gas ejection holes provided in the hydrogen supply nozzle 8b. In addition, a second nozzle is configured by the oxygen supply nozzle 8a provided with a single multi-hole nozzle, and a second gas ejection hole is configured by the plurality of gas ejection holes that are provided in the oxygen supply nozzle 8a as many as at least the process wafers so that they correspond to at least the respective process wafers.

In this embodiment, the arrangement pitch of the gas ejection holes provided in the oxygen supply nozzle 8a is set to be equal to the wafer arrangement pitch. In addition, the respective distances between the respective gas ejection holes provided in the oxygen supply nozzle 8a and the respective wafers corresponding to the respective gas ejection holes in the wafer arrangement direction are set to be equal to one another. Moreover, the number of the gas ejection holes provided in the hydrogen supply nozzle 8b is set to be smaller than the number of the gas ejection holes provided in the oxygen supply nozzle 8a.

In this embodiment, an example of process conditions (oxidation process conditions) in the case of using the oxidation furnace is as follows:

Process temperature (temperature inside the processing chamber): 500 to 1,000° C., Process pressure (pressure inside the processing chamber): 1 to 1,000 Pa, Oxygen gas supply flow rate supplied from main nozzle: 0 to 2,000 sccm, Hydrogen gas supply flow rate supplied from main nozzle: 0 to 500 sccm, Oxygen gas supply flow rate supplied from sub-nozzle (total flow rate): 3,000 to 5,000 sccm, and Hydrogen gas supply flow rate supplied from sub-nozzle (total flow rate): 1,500 to 2,000 sccm.

While maintaining the respective process conditions at constant values within the respective ranges, the oxidation process is performed on the wafers 6. While the lower limits of the oxygen gas supply flow rate and the hydrogen gas supply flow rate supplied from the main nozzle are 0 sccm, this represents a case that performs the oxidation process by using only the sub-nozzle, without using the main nozzle. In this embodiment, as such, the oxidation process may be performed by using only the sub-nozzle.

Figure 21:
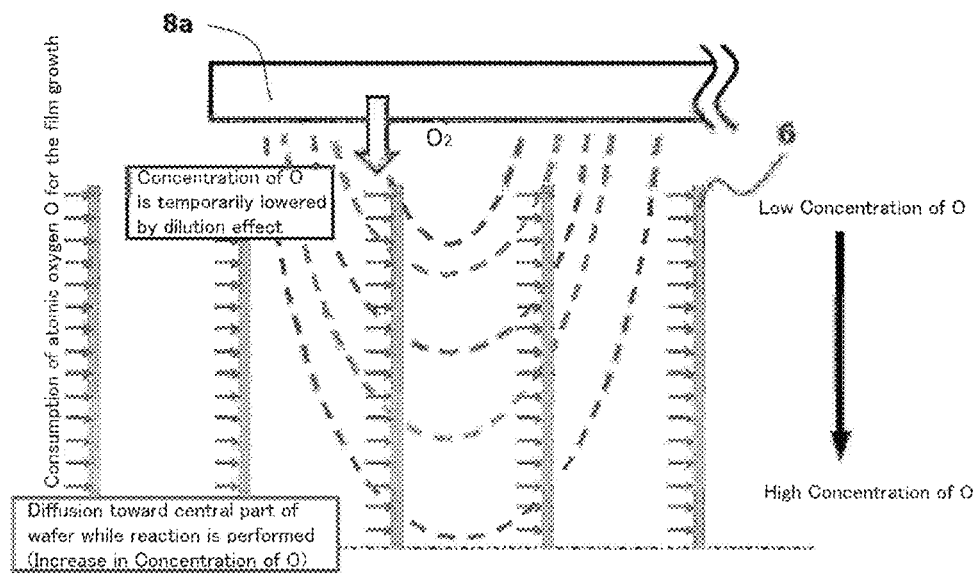
FIG. 21 is a view schematically showing an atomic oxygen O concentration distribution in the vicinity of $O_2$ gas supply points of sub-nozzles when an arrangement pitch of $O_2$ gas supply points is larger than an arrangement pitch of wafers.
Figure 22:
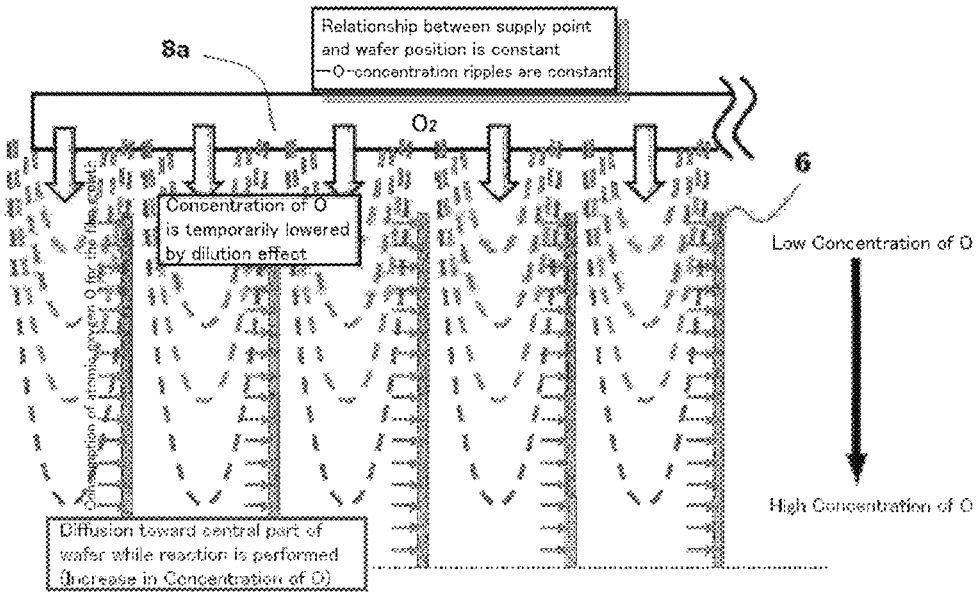
FIG. 22 is a view schematically showing an atomic oxygen O concentration distribution in the vicinity of $O_2$ gas supply points of sub-nozzles when as many $O_2$ gas supply points as wafers are installed such that they correspond to a plurality of wafers, respectively.

Hereinafter, the operation of this embodiment will be described with reference to FIG. 21 to FIG. 23.

First, the control operation of the intra-wafer film thickness uniformity by the addition of $O_2$ gas will be described with reference to FIG. 21 and FIG. 22. FIG. 21 and FIG. 22 schematically show the concentration distributions of atomic oxygen O in the vicinity of the supply point when $O_2$ gas is supplied from the oxygen sub-nozzle (oxygen supply nozzle 8a). In FIG. 21 and FIG. 22, white-background arrows extending from the oxygen supply nozzle 8a toward the wafers 6 represent $O_2$ gas ejection directions from the gas ejection holes, and root parts of the arrows represent the respective gas ejection holes. Since the pressure inside the processing chamber is constant at about 0.5 Torr, the concentration (partial pressure) of the atomic oxygen O in the vicinity of the $O_2$ gas supply point is lowered by a dilution effect. Therefore, contrary to the behavior of the area where no gas is supplied from the sub-nozzle according to the prior art (the concentration of the atomic oxygen O is lowered over the central part of the wafer by the concentration diffusion from mainstream flowing down between the edge part of the wafer and the inner wall of the reaction tube and by the consumption of the atomic oxygen O on the surface of the wafer), the concentration of the atomic oxygen O is lowered at the edge part of the wafer, and thus, the concentration of the atomic oxygen O tends to be increased by the weakening of the dilution effect over the central part of the wafer and the progress of the reaction to generate the atomic oxygen O. Finally, the balance is formed in such a state that the consumption of the atomic oxygen O for the film growth on the surface of the wafer is added to this phenomenon.

In the oxidation furnaces of the first and second embodiments, since the number of the $O_2$ gas supply points is small (for example, 1 location with respect to 15 wafers), the dilution effect remarkably operates in the vicinity of the supply points by the influence of the flow (inertia) during the $O_2$ gas ejection, and thus, the O concentration is lowered in some cases. In this case, as shown in FIG. 21, the intra-wafer concentration distribution of the atomic oxygen O on each wafer 6 is changed at each wafer. As a result, the intra-wafer film thickness distribution tendency (center-convex (⌒) formation) is locally changed. Therefore, in this embodiment, as many $O_2$ gas supply points as at least the process wafers are installed so that they correspond to at least the respective process wafers. That is, in this embodiment, the $O_2$ gas supply points are installed with respect to all the process wafers, and the $O_2$ gas is uniformly supplied from those points to the respective process wafers. In this way, as shown in FIG. 22, since the intra-wafer concentration distributions of the atomic oxygen O on the respective wafers 6 are equalized, it is possible to prevent the change of the local intra-wafer film thickness distribution tendency caused by the influence of the flow (inertia) during the above-described $O_2$ gas ejection. As a result, the intra-wafer film thickness distributions of all the process wafers can be uniformly improved (the film thickness distributions can be suppressed from being the mortar distribution).

On the other hand, when the number of the $O_2$ gas supply points is slightly smaller than the number of the process wafers (for example, when 115 $O_2$ gas supply points are installed with respect to 120 process wafers), the $O_2$ gas supply points do not correspond to the respective process wafers. In this case, in some regions, the $O_2$ gas is not uniformly supplied to the respective process wafers and, in some regions, the intra-wafer concentration distributions of the atomic oxygen O on the process wafers are different at the respective process wafers. Thus, the phenomenon described (change of the local intra-wafer film thickness distribution tendency due to the influence of the flow (inertia) during the $O_2$ gas ejection) is generated to no small extent, and the processing quality is lowered as a whole.

Furthermore, in this embodiment, the distances between the $O_2$ gas supply points and the corresponding process wafers in the height direction are equalized as a whole. That is, in this embodiment, since the height-direction pitch of the $O_2$ gas supply points and the stacking pitch of the process wafers are equalized, the relationship between the $O_2$ gas supply points and the positions of the corresponding process wafers is always constant. Therefore, since the O concentration ripple forms shown in FIG. 22 are equal on all the process wafers, the intra-wafer uniformity of all the process wafers can be uniformly improved.

On the other hand, when the distances between the $O_2$ gas supply points and the corresponding process wafers in the height direction are not equalized at the respective locations (distributed irregularly), that is, the relationship between the $O_2$ gas supply points and the positions of the corresponding process wafers is not constant, the O concentration ripple forms are changed according to the process wafers, and thus, variations occur in the intra-wafer film thickness uniformity improvement effect.

Figure 23:
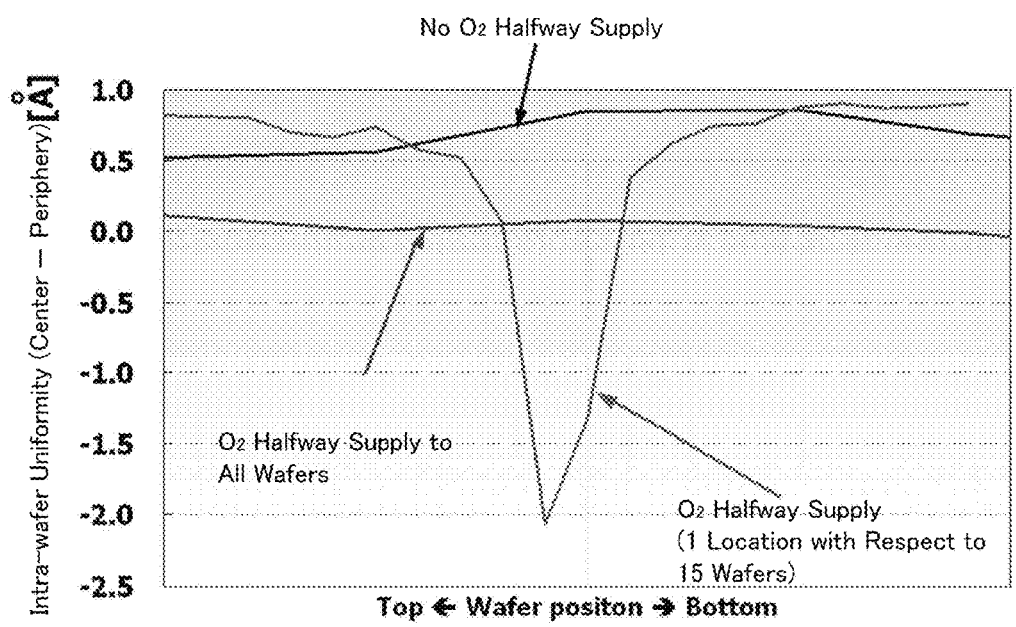
FIG. 23 is a view showing an experimental result of an intra-wafer film thickness uniformity when as many $O_2$ gas supply points as wafers are installed such that they correspond to a plurality of wafers, respectively.

FIG. 23 shows the intra-wafer film thickness distribution result ($O_2$ halfway supply to all the wafers) when $O_2$ gas is supplied from the sub-nozzle at a flow rate of about 5,000 sccm under process conditions that the process temperature is about 900° C., the process pressure is about 0.5 Torr, the flow rate of the $H_2$ gas supplied from the main nozzle is several hundreds of sccm, the flow rate of the $O_2$ gas supplied from the main nozzle is several thousands of sccm, and the total flow rate of the $H_2$ gas supplied from the sub-nozzle is about 1,500 sccm, by using the oxidation furnace of this embodiment. For the purpose of comparison, FIG. 23 also shows the experimental result of the intra-wafer film thickness uniformity of FIG. 19 (No $O_2$ halfway supply, the $O_2$ halfway supply). It can be seen from FIG. 23 that, by uniformly supplying $O_2$ gas with respect to all the process wafers, it is possible to prevent the change of the local intra-wafer film thickness distribution tendency, and the intra-wafer film thickness distribution of all the process wafers can be uniformly improved. From the above description, by the uniform halfway supply of the $O_2$ gas to the respective process wafers, it is possible to uniformly lessen the mortar tendency of the intra-wafer film thickness distributions of all the process wafers while maintaining the inter-wafer film thickness uniformity.

In this embodiment, since the arrangement pitch of the $H_2$ gas supply points (ejection holes) is greater than the wafer arrangement pitch and the arrangement pitch of the $O_2$ gas supply points (for example, about 150-mm pitch), the $H_2$ gas supply points are not installed as many as the process wafers such that they correspond to the respective process wafers. That is, in this embodiment, the number of the $H_2$ gas supply points is smaller than the number of the process wafers and the number of the $O_2$ gas supply points. For example, when the number of the process wafers is 120 sheets, at least 120 $O_2$ gas supply points are installed so that they correspond to at least the respective process wafers. On the contrary, 7 $H_2$ gas supply points (1 location with respect to 15 wafers) are installed. The reason why as many $H_2$ gas supply points as the process wafers need not be installed is as follows. That is, since the $H_2$ gas has a smaller molecular diameter than the $O_2$ gas and has a higher diffusion rate under the environment of about 0.5 Torr, it is sufficiently diffused even though the supply points are not installed with respect to the respective process wafers. Therefore, it can be said that the intra-wafer film thickness uniformity is less influenced by the existence/nonexistence of the supply points of the $H_2$ gas, and the processing quality necessary for the actual state can be sufficiently satisfied even with a smaller number of the supply points than the number of the process wafers. In this embodiment, the height of the hydrogen supply nozzle 8b is lower than the height of the oxygen supply nozzle 8a. However, the height of the hydrogen supply nozzle 8b may also be equal to the height of the oxygen supply nozzle 8a. That is, like the oxygen supply nozzle 9a, the hydrogen supply nozzle 8b may reach up to the height of the top wafer.

In this embodiment, as described above, the oxidation process may be performed by using only the sub-nozzle, without using the main nozzle. That is, the oxidation process may performed by supplying $O_2$ gas and $H_2$ gas from only the sub-nozzle (oxygen supply nozzle 8a, hydrogen supply nozzle 8b), without supplying $O_2$ gas and $H_2$ gas from the main nozzle 7 (oxygen supply nozzle 7a, hydrogen supply nozzle 7b). In this case, inert gas such as $N_2$ gas may be supplied from the main nozzle 7. In this way, the concentration of $H_2$ gas, $O_2$ gas or atomic oxygen O at the upper part inside the processing chamber can be finely adjusted. Moreover, gas curtain by the inert gas may be formed, and unnecessary diffusion of $H_2$ gas, $O_2$ gas or atomic oxygen O can be suppressed at the upper part inside the processing chamber.

Additionally, in this embodiment, the oxidation process may be performed even though one of $O_2$ gas and $H_2$ gas is supplied from the main nozzle. That is, the oxidation process may be performed by supplying $H_2$ gas from the hydrogen supply nozzle 7b as the main nozzle and supplying $O_2$ gas and $H_2$ gas from the sub-nozzle (oxygen supply nozzle 8a, hydrogen supply nozzle 8b), without supplying $O_2$ gas from the oxygen supply nozzle 7a as the main nozzle. In this case, the concentration of $H_2$ gas at the upper part of the processing chamber can be finely adjusted, and the film thickness of the oxide film formed on the process wafer at the upper part of the wafer arrangement area can be finely adjusted. In addition, the oxidation process may be performed by supplying $O_2$ gas from the oxygen supply nozzle 7a as the main nozzle and supplying $O_2$ gas and $H_2$ gas from the sub-nozzle (oxygen supply nozzle 8a, hydrogen supply nozzle 8b), without supplying $H_2$ gas from the hydrogen supply nozzle 7b as the main nozzle. In this case, the concentration of $O_2$ gas at the upper part of the processing chamber can be finely adjusted, and the film thickness of the oxide film formed on the process wafer at the upper part of the wafer arrangement area can be finely adjusted.

Fourth Embodiment

Next, a fourth embodiment of the present invention will be described.

In the oxidation furnace of the above-described third embodiment, the above explanation has been given on the example in which the arrangement pitch of the gas ejection holes installed in the hydrogen sub-nozzle (hydrogen supply nozzle 8b) is greater than the wafer arrangement pitch and the arrangement pitch of the $O_2$ gas ejection holes (for example, about 150-mm pitch). That is, the example in which the number of the $H_2$ gas ejection holes is smaller than the number of the process wafers and the number of the $O_2$ gas ejection holes has been described above. As described above, the processing quality necessary for the actual state can be sufficiently satisfied even when the $H_2$ gas ejection holes are not installed as many as the process wafers. On the other hand, the inventors found that the further excellent intra-wafer and inter-wafer film thickness uniformity could be obtained by installing as many $H_2$ gas ejection holes as at least the process wafers, just like the $O_2$ gas ejection holes, so that they correspond to at least the respective process wafers. Hereinafter, explanation will be given on an example, as the fourth embodiment, in which the gas ejection holes of the hydrogen sub-nozzle are installed as many as at least the process wafers, just like the gas ejection holes of the oxygen sub-nozzle, so that they correspond to at least the respective process wafers.

Figure 24:
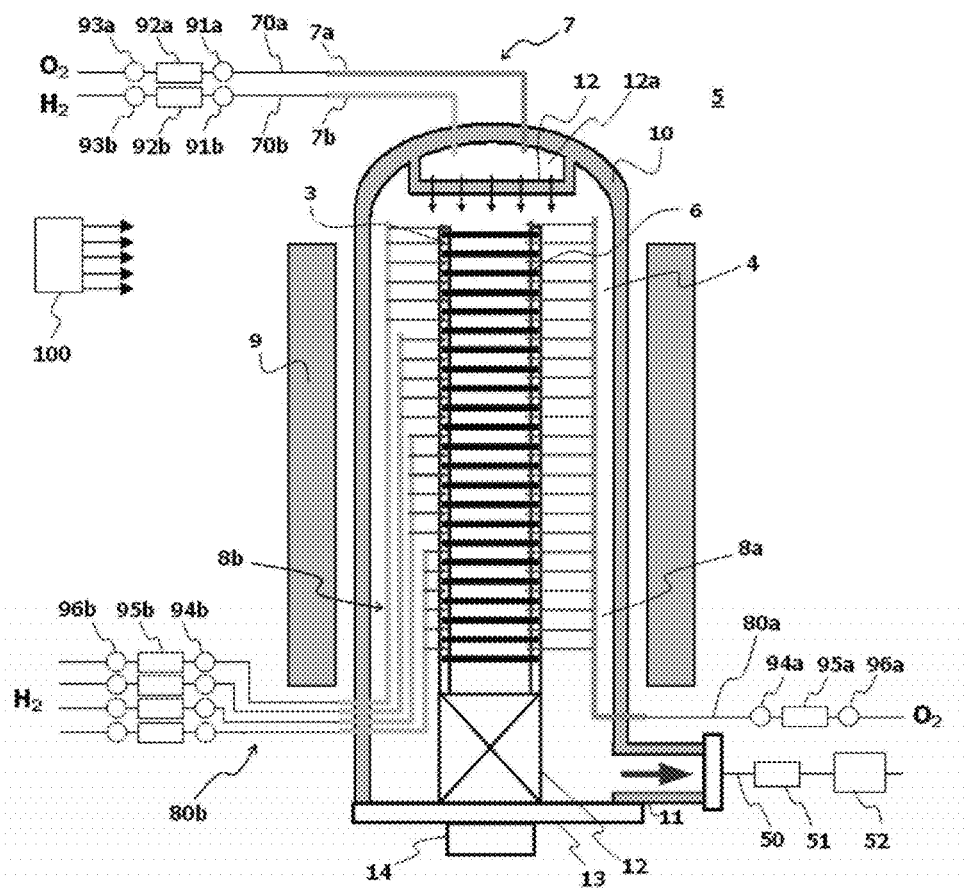
FIG. 24 is a schematic sectional view showing a configuration of a heat-treating furnace in accordance with a fourth embodiment of the present invention.

As a substrate processing apparatus in accordance with a fourth embodiment of the present invention, a batch-type vertical semiconductor manufacturing apparatus (oxidation apparatus) will be described with reference to FIG. 24. FIG. 24 is a schematic sectional view showing a configuration example of a heat-treating furnace (oxidation furnace) relevant to the fourth embodiment.

Only difference between the oxidation furnace (FIG. 24) of the fourth embodiment and the oxidation furnace (FIG. 20) of the third embodiment is the configuration of the hydrogen supply nozzle 8b. The other configurations are the same as the third embodiment. In this embodiment, the hydrogen supply nozzle 8b is configured by a plurality (four) of nozzles each having a different length, and the longest nozzle reaches up to the top process wafer along the inner wall of the sidewall of the reaction tube 10. That is, the hydrogen supply nozzle 8b extends over the entire wafer arrangement area. In order to supply $H_2$ gas uniformly to the respective process wafers, the hydrogen supply nozzle 8b is provided with as many gas ejection holes as at least the process wafers so that they correspond to at least the respective process wafers. For example, when the number of the process wafers is 120 sheets, at least 120 $H_2$ gas ejection holes are installed so that they correspond to the respective process wafers. In this case, each of the plurality (four) of nozzles constituting the hydrogen supply nozzle 8b is provided with 30 $H_2$ gas ejection holes. In addition to the configuration in which as many $H_2$ gas ejection holes as the process wafers are installed so that they correspond to the respective process wafers, the $H_2$ gas ejection holes may be installed at locations that do not correspond to the process wafers, that is, areas other than the wafer arrangement area. The gas ejection holes are configured by relatively small holes so that $H_2$ gas is ejected to the respective process wafers at a uniform flow rate. The hydrogen supply nozzle 8b is configured by, for example, a plurality (four) of multi-hole nozzles in which as many holes of about ϕ 0.5-1 mm as the process wafers are installed in a plurality (four) of pipes of about ϕ 10-20 mm. The hydrogen supply nozzle 8b may be configured to supply $H_2$ gas uniformly to all the process wafers, and may be configured by a single multi-hole nozzle. In FIG. 24, the same reference numerals as those of FIG. 12, FIG. 18 and FIG. 20 are assigned to the substantially same elements as those of FIG. 12, FIG. 18 and FIG. 20 and their description will be omitted.

In this embodiment, a first nozzle is configured by the hydrogen supply nozzle 8b provided with a plurality of nozzles each having a different length, and a first gas ejection hole is configured by gas ejection holes provided in the hydrogen supply nozzles 8b installed as many as at least the process wafers so they correspond to at least the respective process wafers. In addition, a second nozzle is configured by the oxygen supply nozzle 8a provided with a single multi-hole nozzle, and a second gas ejection hole is configured by gas ejection holes provided in the oxygen supply nozzles 8a installed as many as at least the process wafers so that they correspond to at least the respective process wafers. That is, in this embodiment, both the gas ejection holes of the hydrogen supply nozzle 8b and the gas ejection holes of the oxygen supply nozzle 8a are installed as many as at least the process wafers so that they correspond to at least the respective process wafers.

In this embodiment, the arrangement pitch of the gas ejection holes provided in the hydrogen supply nozzle 8b is set to be equal to the wafer arrangement pitch and also set to be equal to the arrangement pitch of the gas ejection holes provided in the oxygen supply nozzle 8a. In addition, the respective distances between the respective gas ejection holes provided in the hydrogen supply nozzle 8b and the respective wafers corresponding to the respective gas ejection holes in the wafer arrangement direction are set to be equal to one another. The respective distances between the respective gas ejection holes provided in the oxygen supply nozzle 8a and the respective wafers corresponding to the respective gas ejection holes in the wafer arrangement direction are set to be equal to one another. Moreover, the number of the gas ejection holes provided in the hydrogen supply nozzle 8b is set to be equal to the number of the gas ejection holes provided in the oxygen supply nozzle 8a. The gas ejection holes provided in the hydrogen supply nozzle 8b are in 1:1 correspondence with the gas ejection holes provided in the oxygen supply nozzle 8a. The plurality of gas ejection holes provided in the hydrogen supply nozzle 8b and the plurality of gas ejection holes provided in the oxygen supply nozzle 8a are installed at the same heights, respectively.

According to this embodiment, since both of $H_2$ gas and $O_2$ gas are supplied to all the process wafers from the supply points having the same position relationship, the concentration difference caused by the existence/nonexistence of the $H_2$ gas supply points in the third embodiment can be removed (influence on the intra-wafer film thickness uniformity is less), and thus, more excellent intra-wafer and inter-wafer film thickness uniformity can be obtained. While the processing quality necessary for the actual state is sufficiently satisfied in the oxidation furnace described above in third embodiment, more excellent intra-wafer and inter-wafer film thickness uniformity can be obtained in this embodiment.

In this embodiment, like the third embodiment, the oxidation process may be performed by using only the sub-nozzle, without using the main nozzle. That is, the oxidation process may be performed by supplying $O_2$ gas and $H_2$ gas from only the sub-nozzle (oxygen supply nozzle 8a, hydrogen supply nozzle 8b), without supplying $O_2$ gas and $H_2$ gas from the main nozzle 7 (oxygen supply nozzle 7a, hydrogen supply nozzle 7b).

Additionally, in this embodiment, like the third embodiment, the oxidation process may be performed even though one of $O_2$ gas and $H_2$ gas is supplied from the main nozzle. That is, the oxidation process may be performed by supplying $H_2$ gas from the hydrogen supply nozzle 7b as the main nozzle and supplying $O_2$ gas and $H_2$ gas from the sub-nozzle (oxygen supply nozzle 8a, hydrogen supply nozzle 8b), without supplying $O_2$ gas from the oxygen supply nozzle 7a as the main nozzle. In addition, the oxidation process may be performed by supplying $O_2$ gas from the oxygen supply nozzle 7a as the main nozzle and supplying $O_2$ gas and $H_2$ gas from the sub-nozzle (oxygen supply nozzle 8a, hydrogen supply nozzle 8b), without supplying $H_2$ gas from the hydrogen supply nozzle 7b as the main nozzle.

According to the present invention, there are provided a substrate processing apparatus, which is capable of improving the intra-wafer film thickness uniformity by suppressing the intra-wafer film thickness distribution from being the center-concave (凹) distribution, while maintaining the inter-wafer film thickness uniformity, and a method of manufacturing a semiconductor device, which includes a process of processing a substrate by using the substrate processing apparatus.

The disclosures of Japanese Patent Application No. 2008-13372, filed on May 22, 2008, and International Patent Application No. PCT/JP2009/056107, filed Mar. 26, 2009, including specification, claim, drawing, and abstract, are incorporated herein by reference in their entirety.

PREFERRED EMBODIMENTS OF THE PRESENT INVENTION

Hereinafter, preferred embodiments of the present invention will be complementarily noted.

According to an embodiment, there is provided a substrate processing apparatus including: a reaction tube configured to process a plurality of substrates; a heater configured to heat an inside of the reaction tube; a holder configured to arrange and hold the plurality of substrates within the reaction tube; a hydrogen-containing gas supply system including a first nozzle disposed in an area which horizontally surrounds a substrate arrangement area where the plurality of substrates are arranged, and configured to supply a hydrogen-containing gas from a plurality of locations of the area into the reaction tube; an oxygen-containing gas supply system including a second nozzle disposed in the area which horizontally surrounds the substrate arrangement area, and configured to supply an oxygen-containing gas from a plurality of locations of the area into the reaction tube; a pressure controller configured to control a pressure inside the reaction tube to be lower than an atmospheric pressure; and a controller configured to control the heater, the hydrogen-containing gas supply system, the oxygen-containing gas supply system and the pressure controller such that the hydrogen-containing gas and the oxygen-containing gas are supplied simultaneously into the reaction tube accommodating the plurality of substrates and being under a heated atmosphere having a pressure lower than an atmospheric pressure through the first nozzle and the second nozzle, respectively, so that the hydrogen-containing gas and the oxygen-containing gas react with each other in the area which horizontally surrounds the substrate arrangement area to form a reactive species in the reaction tube, thereby thermally oxidizing each of the plurality of substrates by the reactive species, wherein the first nozzle is provided with a plurality of first gas ejection holes, and the second nozzle is provided with as many second gas ejection holes as at least the plurality of substrates such that at least each of the second gas ejection holes corresponds to each of the plurality of substrates.

Preferably, the second gas ejection holes are configured to eject the oxygen-containing gas to each of the plurality of substrates at a uniform flow rate.

Preferably, a distance in a substrate arrangement direction between one of the second gas ejection holes and one of the substrates corresponding to the one of the second gas ejection holes is constant.

Preferably, an arrangement pitch of the second gas ejection holes is equal to that of the substrates.

Preferably, a number of the first gas ejection holes is smaller than that of the second gas ejection holes.

Preferably, the first gas ejection holes are installed as many as at least the plurality of substrates such that each of the plurality of first gas ejection holes corresponds to each of the plurality of substrates.

Preferably, an arrangement pitch of the first gas ejection holes is equal to that of the substrates.

Preferably, a distance in a substrate arrangement direction between one of the plurality of first gas ejection holes and one of the substrates corresponding to the one of the plurality of first gas ejection holes is constant.

Preferably, a number of the first gas ejection holes is equal to that of the second gas ejection holes.

Preferably, the first gas ejection holes are installed as many as the second gas ejection holes According to another embodiment, there is provided a method of manufacturing a semiconductor device, including: loading a plurality of substrates into a reaction tube; processing the plurality of substrates by supplying hydrogen-containing gas and oxygen-containing gas into the reaction tube, which is in a heated state, with pressure inside the reaction tube being lower than atmospheric pressure, respectively through a first nozzle and a second nozzle disposed in an area corresponding to a substrate arrangement area where the plurality of substrates are arranged; and unloading the plurality of processed substrates from the reaction tube, wherein when the substrates are processed, the hydrogen-containing gas is supplied into the reaction tube from a plurality of locations of the area corresponding to the substrate arrangement area through a plurality of first gas ejection holes installed in the first nozzle and, at the same time, the oxygen-containing gas is supplied into the reaction tube from a plurality of locations of the area corresponding to the substrate arrangement area through second gas ejection holes installed as many as at least the plurality of substrates in the second nozzle so that the second gas ejection holes are in 1:1 correspondence with at least the plurality of substrates.

What is claimed is:

1. A method of manufacturing a semiconductor device, comprising:
    loading a plurality of substrates into a reaction tube;
    processing the plurality of substrates by supplying hydrogen-containing gas and oxygen-containing gas into the reaction tube, which is in a heated state, with pressure inside the reaction tube being lower than atmospheric pressure, respectively through a first nozzle and a second nozzle disposed in an area corresponding to a substrate arrangement area where the plurality of substrates are arranged and generating atomic oxygen by a reaction of the hydrogen-containing gas and the oxygen-containing gas to form oxide films on surfaces of the substrates; and unloading the plurality of processed substrates from the reaction tube, wherein in the act of processing the plurality of substrates, the hydrogen-containing gas is supplied into the reaction tube from a plurality of locations of the area corresponding to the substrate arrangement area through a plurality of first gas ejection holes installed in the first nozzle and, at the same time, the oxygen-containing gas is supplied into the reaction tube from a plurality of locations of the area corresponding to the substrate arrangement area through second gas ejection holes installed as many as at least the plurality of substrates in the second nozzle so that the second gas ejection holes are in 1:1 correspondence with at least the plurality of substrates, and at that time, the hydrogen-containing gas is further supplied into the reaction tube from a supply port installed on a ceiling wall of the reaction tube without supplying the oxygen-containing gas into the reaction tube from the supply port, the oxygen-containing gas is further supplied into the reaction tube from the supply port without supplying the hydrogen-containing gas into the reaction tube from the supply port, or inert gas is further supplied into the reaction tube from the supply port without supplying the hydrogen-containing gas and the oxygen-containing gas into the reaction tube from the supply port, so as to finely adjust concentration of the hydrogen-containing gas, the oxygen-containing gas, or the atomic oxygen at an upper part inside the reaction tube and thereby finely adjust thicknesses of the oxide films formed on the surfaces of the substrates at an upper part of the substrate arrangement area.

2. The method according to claim 1, wherein in the act of processing the plurality of substrates, an inside of the reaction tube is exhausted from an exhaust outlet installed below the first gas ejection holes and the second gas ejection holes.

3. The method according to claim 1, wherein a number of the first gas ejection holes is smaller than that of the substrates.

4. The method according to claim 1, wherein an arrangement pitch of the first gas ejection holes is larger than that of the substrates.

5. The method according to claim 1, wherein a number of the first gas ejection holes is smaller than that of the second gas ejection holes.

6. The method according to claim 1, wherein an arrangement pitch of the first gas ejection holes is larger than that of the second gas ejection holes.

7. The method according to claim 1, wherein the hydrogen-containing gas comprises $H_2$ gas and the oxygen-containing gas comprises $O_2$ gas.

8. The method according to claim 1, wherein in the act of processing the plurality of substrates the oxide films are formed by oxidizing the surfaces of the substrates.

9. The method according to claim 1, wherein in the act of processing the plurality of substrates the oxide films are formed by oxidizing the surfaces of the substrates with the atomic oxygen.

10. The method according to claim 1, wherein the supply port is configured to supply gas in a shower manner.

11. A method of manufacturing a semiconductor device, comprising:

loading a plurality of substrates into a reaction tube;

processing the plurality of substrates by supplying hydrogen-containing gas and oxygen-containing gas into the reaction tube, which is in a heated state, with pressure inside the reaction tube being lower than atmospheric pressure, respectively through a first nozzle and a second nozzle disposed in an area corresponding to a substrate arrangement area where the plurality of substrates are arranged and generating atomic oxygen by a reaction of the hydrogen-containing gas and the oxygen-containing gas to form oxide films on surfaces of the substrates; and unloading the plurality of processed substrates from the reaction tube, wherein in the act of processing the plurality of substrates, the hydrogen-containing gas is supplied into the reaction tube from a plurality of locations of the area corresponding to the substrate arrangement area through a plurality of first gas ejection holes installed in the first nozzle and, at the same time, the oxygen-containing gas is supplied into the reaction tube from a plurality of locations of the area corresponding to the substrate arrangement area through second gas ejection holes installed as many as at least the plurality of substrates in the second nozzle so that the second gas ejection holes are in 1:1 correspondence with at least the plurality of substrates, and at that time, inert gas is further supplied into the reaction tube from a supply port installed on a ceiling wall of the reaction tube without supplying the hydrogen-containing gas and the oxygen-containing gas into the reaction tube from the supply port, so as to finely adjust concentration of the hydrogen-containing gas, the oxygen-containing gas, or the atomic oxygen at an upper part inside the reaction tube and thereby finely adjust thicknesses of the oxide films formed on the surfaces of the substrates at an upper part of the substrate arrangement area.

12. A method of processing a substrate, comprising:

loading a plurality of substrates into a reaction tube;

processing the plurality of substrates by supplying hydrogen-containing gas and oxygen-containing gas into the reaction tube, which is in a heated state, with pressure inside the reaction tube being lower than atmospheric pressure, respectively through a first nozzle and a second nozzle disposed in an area corresponding to a substrate arrangement area where the plurality of substrates are arranged and generating atomic oxygen by a reaction of the hydrogen-containing gas and the oxygen-containing gas to form oxide films on surfaces of the substrates; and unloading the plurality of processed substrates from the reaction tube, wherein in the act of processing the plurality of substrates, the hydrogen-containing gas is supplied into the reaction tube from a plurality of locations of the area corresponding to the substrate arrangement area through a plurality of first gas ejection holes installed in the first nozzle and, at the same time, the oxygen-containing gas is supplied into the reaction tube from a plurality of locations of the area corresponding to the substrate arrangement area through second gas ejection holes installed as many as at least the plurality of substrates in the second nozzle so that the second gas ejection holes are in 1:1 correspondence with at least the plurality of substrates, and at that time, the hydrogen-containing gas is further supplied into the reaction tube from a supply port installed on a ceiling wall of the reaction tube without supplying the oxygen-containing gas into the reaction tube from the supply port, the oxygen-containing gas is further supplied into the reaction tube from the supply port without supplying the hydrogen-containing gas into the reaction tube from the supply port, or inert gas is further supplied into the reaction tube from the supply port without supplying the hydrogen-containing gas and the oxygen-containing gas into the reaction tube from the supply port, so as to finely adjust concentration of the hydrogen-containing gas, the oxygen-containing gas, or the atomic oxygen at an upper part inside the reaction tube and thereby finely adjust thicknesses of the oxide films formed on the surfaces of the substrates at an upper part of the substrate arrangement area.

* * * * *